(12) United States Patent
Dong et al.

(10) Patent No.: US 8,982,637 B1
(45) Date of Patent: Mar. 17, 2015

(54) VREAD BIAS ALLOCATION ON WORD LINES FOR READ DISTURB REDUCTION IN 3D NON-VOLATILE MEMORY

(71) Applicant: SanDisk Technologies Inc., Plano, TX (US)

(72) Inventors: Yingda Dong, San Jose, CA (US); Chenfeng Zhang, San Jose, CA (US); Wendy Ou, San Jose, CA (US); Seung Yu, San Ramon, CA (US); Masaaki Higashitani, Cupertino, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/025,160

(22) Filed: Sep. 12, 2013

(51) Int. Cl.
*G11C 16/06* (2006.01)
*G11C 16/26* (2006.01)

(52) U.S. Cl.
CPC ...................................... *G11C 16/26* (2013.01)
USPC ............ 365/185.21; 365/186.17; 365/185.18; 365/185.28

(58) Field of Classification Search
USPC .............. 365/185.17, 185.18, 185.21, 185.28
See application file for complete search history.

(56) References Cited

U.S. PATENT DOCUMENTS

| | | | |
|---|---|---|---|
| 6,246,610 B1 | 6/2001 | Han et al. |
| 6,269,025 B1 | 7/2001 | Hollmer et al. |
| 6,937,521 B2 | 8/2005 | Avni et al. |
| 7,149,121 B2 | 12/2006 | Lin et al. |
| 7,564,715 B2 | 7/2009 | Mokhlesi |
| 7,570,520 B2 | 8/2009 | Kamei et al. |
| 7,606,091 B2 | 10/2009 | Li et al. |
| 7,679,961 B2 | 3/2010 | Lee et al. |
| 7,688,632 B2 | 3/2010 | Nagashima et al. |
| 7,907,463 B2 | 3/2011 | Edahiro et al. |
| 7,916,543 B2 | 3/2011 | Goda et al. |
| 8,018,769 B2 | 9/2011 | Tu et al. |
| 8,036,044 B2 | 10/2011 | Dong et al. |
| 8,149,625 B2 | 4/2012 | Hwang |
| 8,264,885 B2 | 9/2012 | Goda et al. |
| 8,320,185 B2 | 11/2012 | Marquart |
| 2011/0164454 A1 | 7/2011 | Hwang |
| 2011/0199833 A1 | 8/2011 | Shim et al. |

(Continued)

OTHER PUBLICATIONS

Yanagihara, Yuki, et al., "Control Gate Length, Spacing and Stacked Layer Number Design for 3D-Stackable NAND Flash Memory," 4th IEEE International Memory Workshop, May 20-23, 2012, 4 pages.

(Continued)

*Primary Examiner* — Hoai V Ho
(74) *Attorney, Agent, or Firm* — Vierra Magen Marcus LLP

(57) ABSTRACT

Techniques are provided for sensing memory cells in a 3D stacked non-volatile memory device in a way which reduces read disturb, by using read pass voltages which are adjusted based on variations in a memory hole diameter. The memory cells are in NAND strings which extend in the memory holes. A larger read pass voltage is used for memory cells which are adjacent to wider portions of the memory holes, and a smaller read pass voltage is used for memory cells which are adjacent to narrower portions of the memory holes. This approach reduces the worst-case read disturb. Further, an overall resistance in the NAND string channel may be substantially unchanged so that a reference current used during sensing may be unchanged. The read pass voltage may be set based on a program voltage trim value, which is indicative of programming speed and memory hole diameter.

20 Claims, 18 Drawing Sheets

(56) References Cited

U.S. PATENT DOCUMENTS

2011/0317489 A1 12/2011 Kim et al.
2012/0287710 A1 11/2012 Shirakawa
2012/0300561 A1* 11/2012 Yun et al. .................. 365/189.09

OTHER PUBLICATIONS

Kim, Jiyoung, et al., "A stacked memory device on logic 3D technology for ultra-high-density data storage," Nanotechnology 22, May 16, 2011, 8 pages.
Aochi, Hideaki, 'BiCS Flash as a Future 3D Non-volatile Memory Technology for Ultra High Density Storage Devices, IEEE International Memory Workshop, May 2009, 2 pages.
Hsiao, Yi-Hsuan, et al., "A Critical Examination of 3D Stackable NAND Flash Memory Architectures by Simulation Study of the Scaling Capability," IEEE International Memory Workshop, May 2010, 4 pages.
Ishiduki, Megumi, et al., "Optimal Device Structure for Pipe-shaped BiCS Flash Memory for Ultra High Density Storage Device with Excellent Performance and Reliability," IEEE International Electron Devices Meeting, Dec. 2009, 4 pages.
Katsumata, Ryota, et al., "Pipe-shaped BiCS Flash Memory with 16 Stacked Layers and Multi-Level-Cell Operation for Ultra High Density Storage Devices," Symposium on VLSI Technology Digest of Technical Papers, Jun. 2009, pp. 136-137.
Nitayama, Akihiro, et al., "Bit Cost Scalable (BiCS) Flash Technology for Future Ultra High Density Storage Devices," International Symposium on VLSI Technology Systems and Applications (VLSI-TSA), Apr. 2010, 2 pages.
U.S. Appl. No. 13/910,388, filed Jun. 5, 2013.
U.S. Appl. No. 13/940,504, filed Jul. 12, 2013.
International Search Report & The Written Opinion of the International Searching Authority dated Dec. 5, 2014, International Application No. PCT/US2014/054865.

* cited by examiner

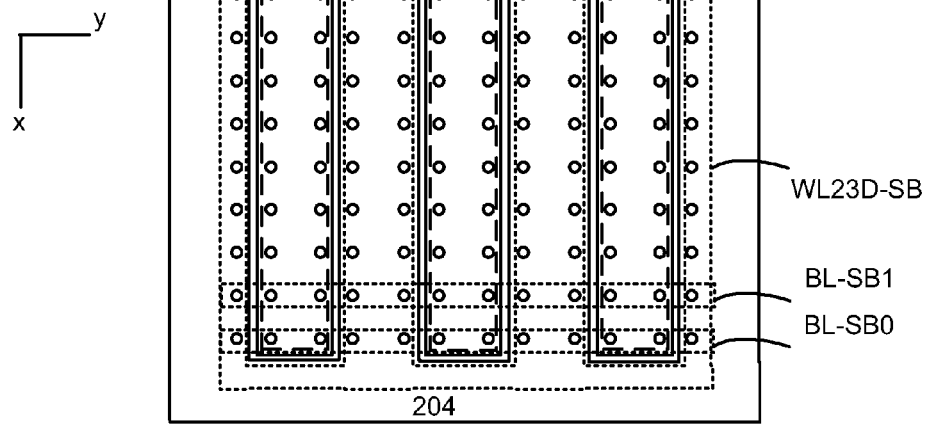
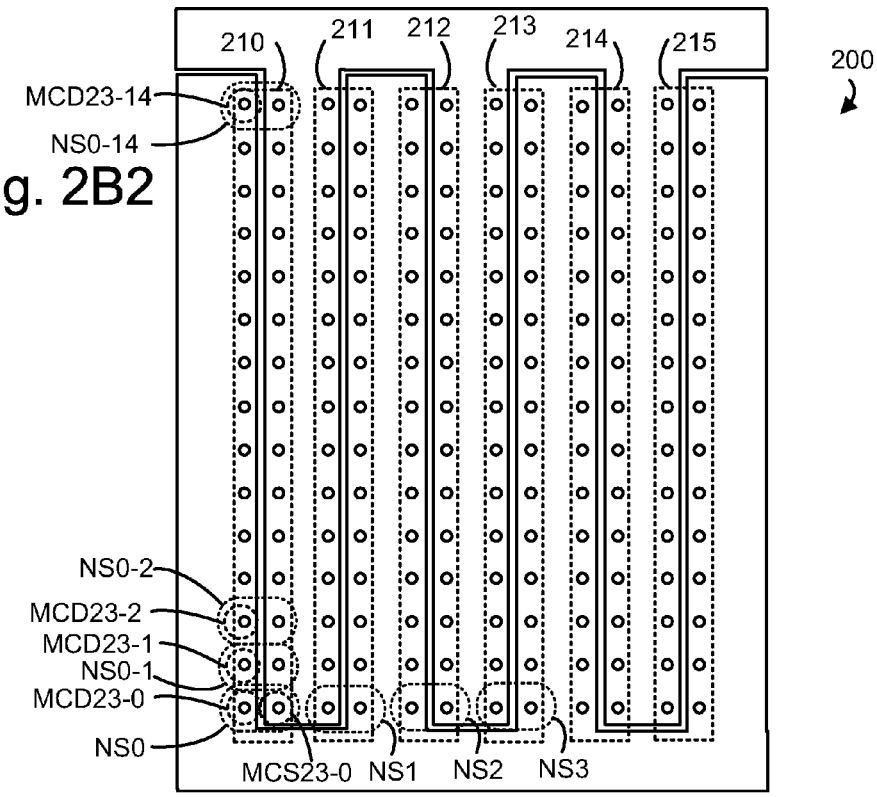

Fig. 2B3
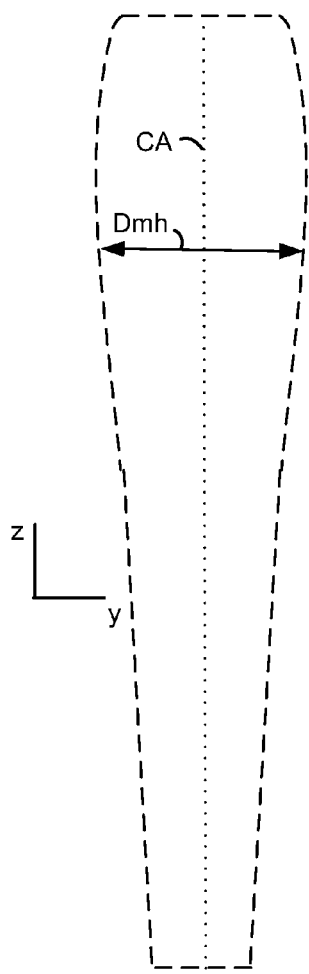
Fig. 2B5
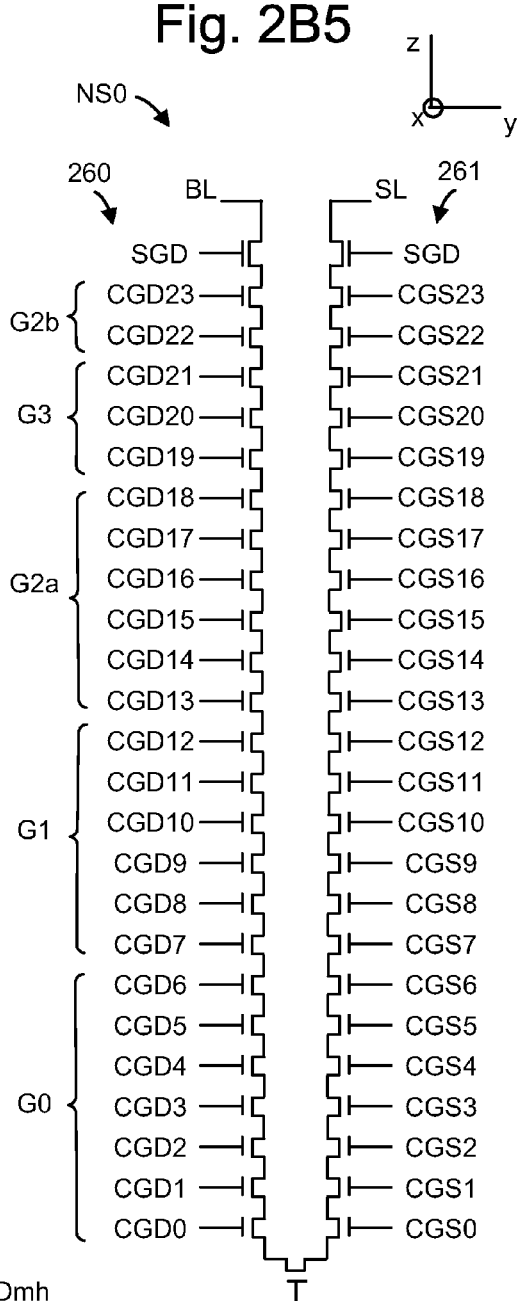
Fig. 2B4
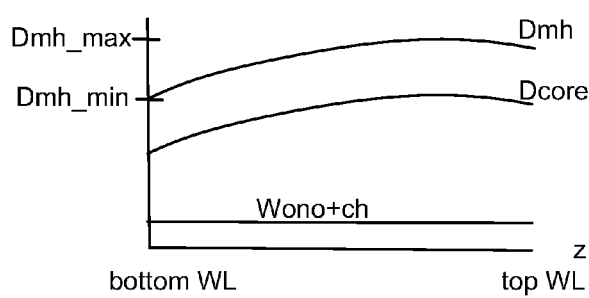

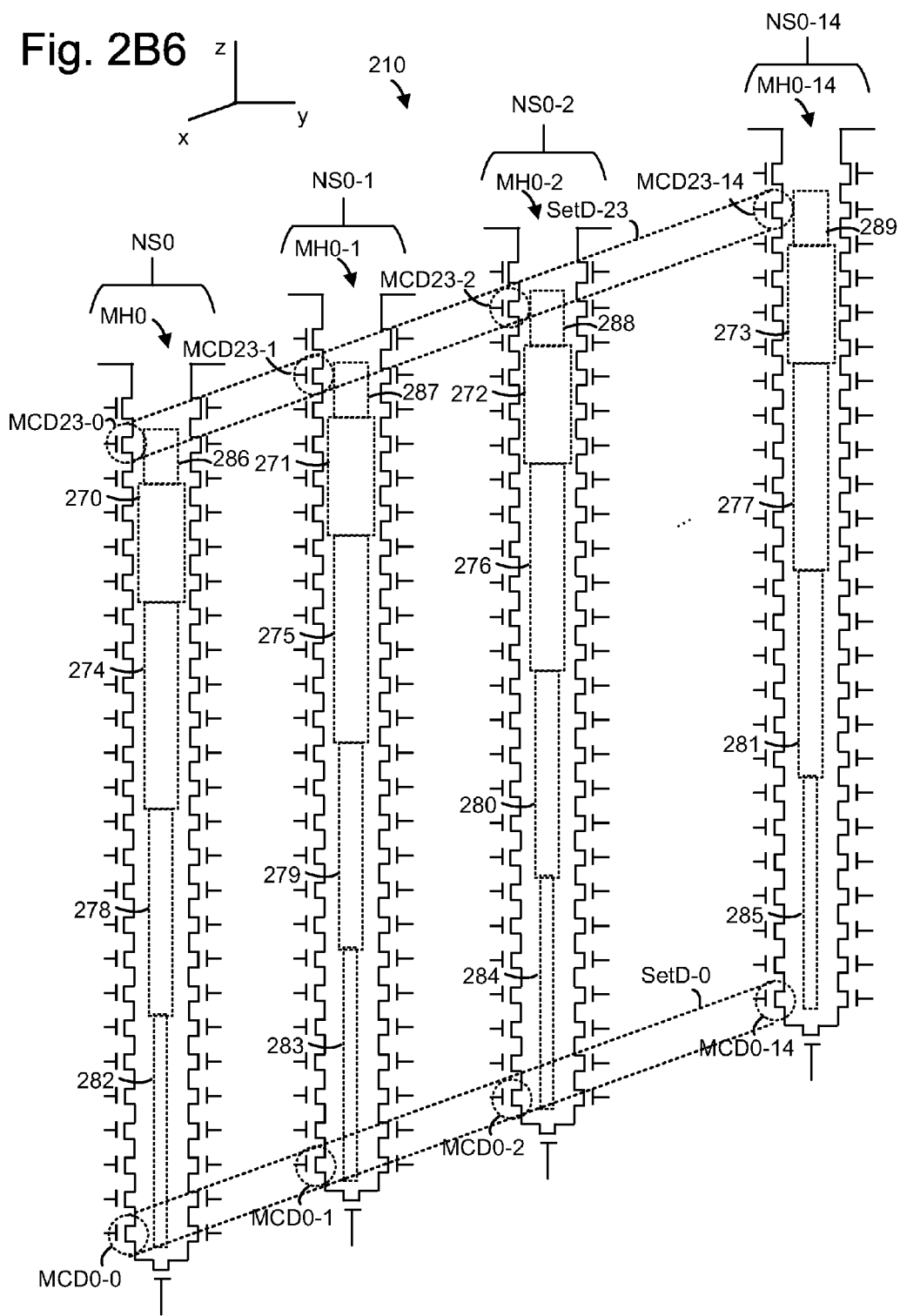
Fig. 2B6

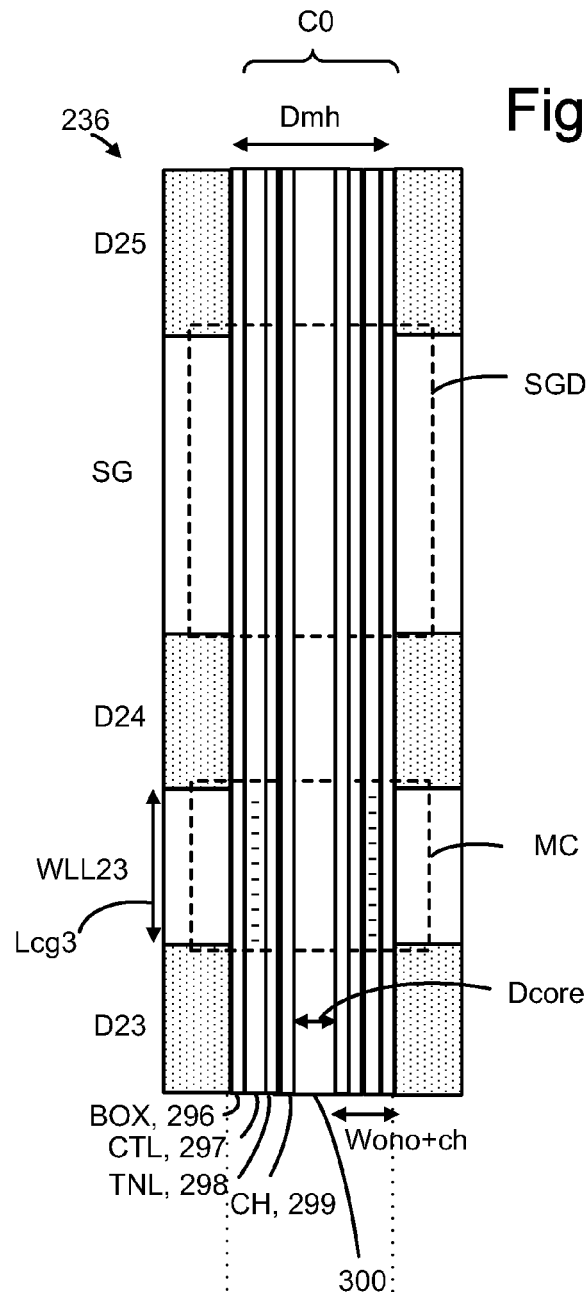
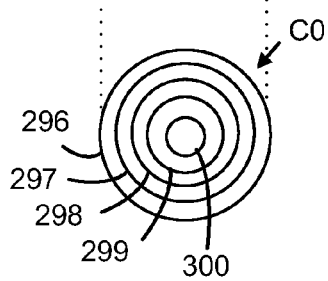
Fig. 3A
Fig. 3B

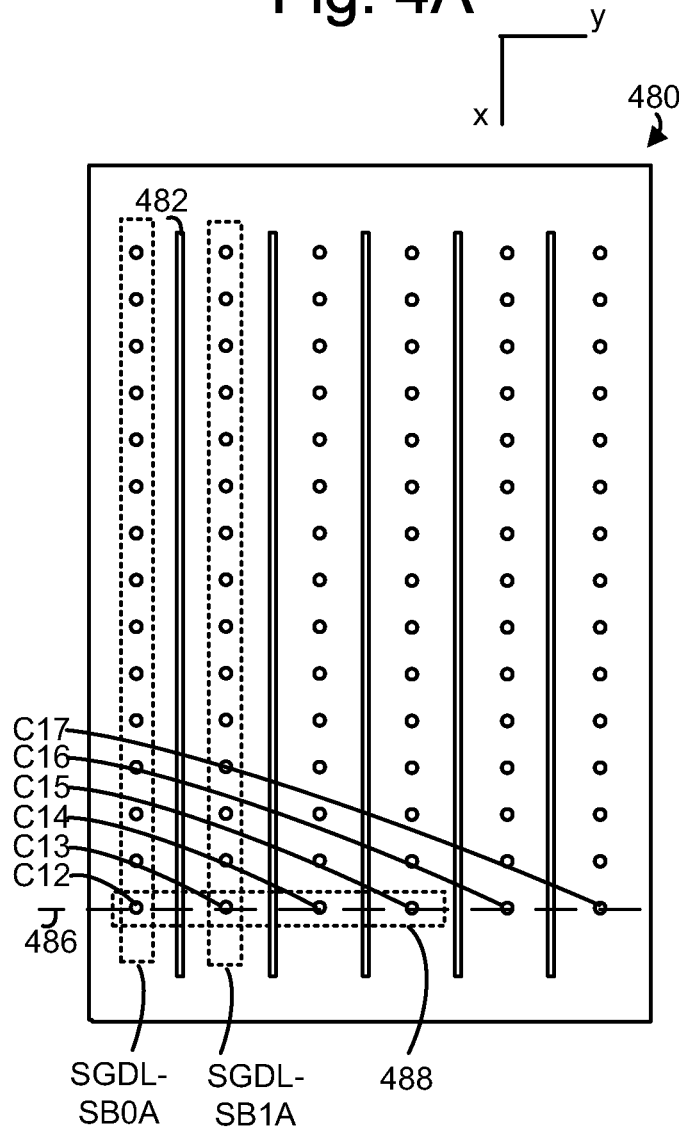

Fig. 4B1
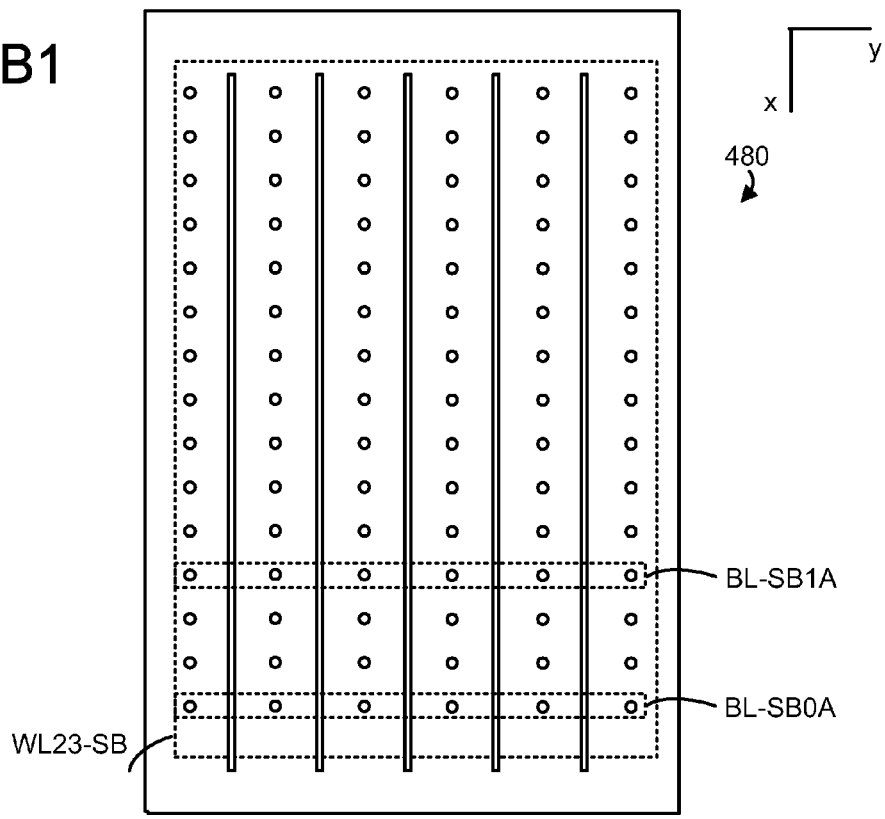
Fig. 4B2
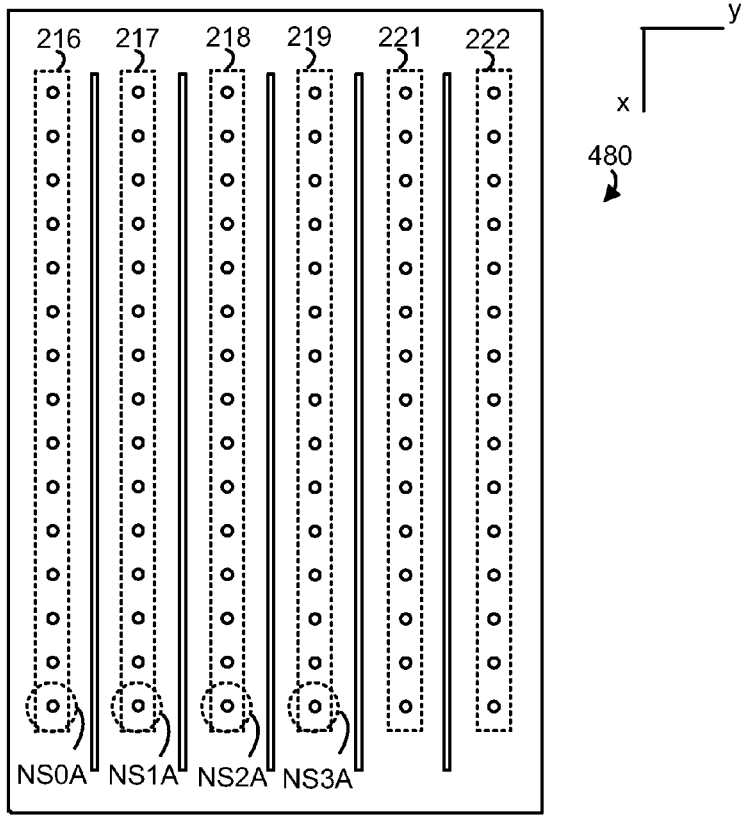

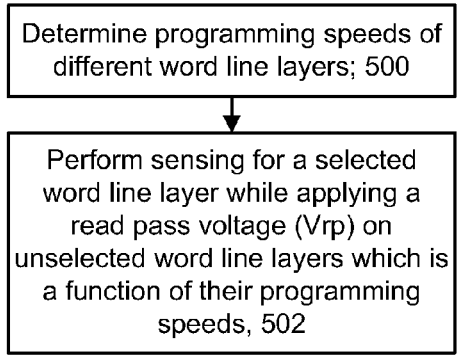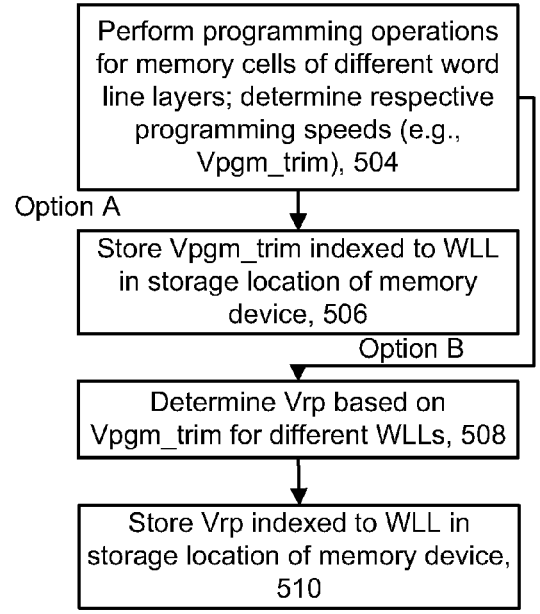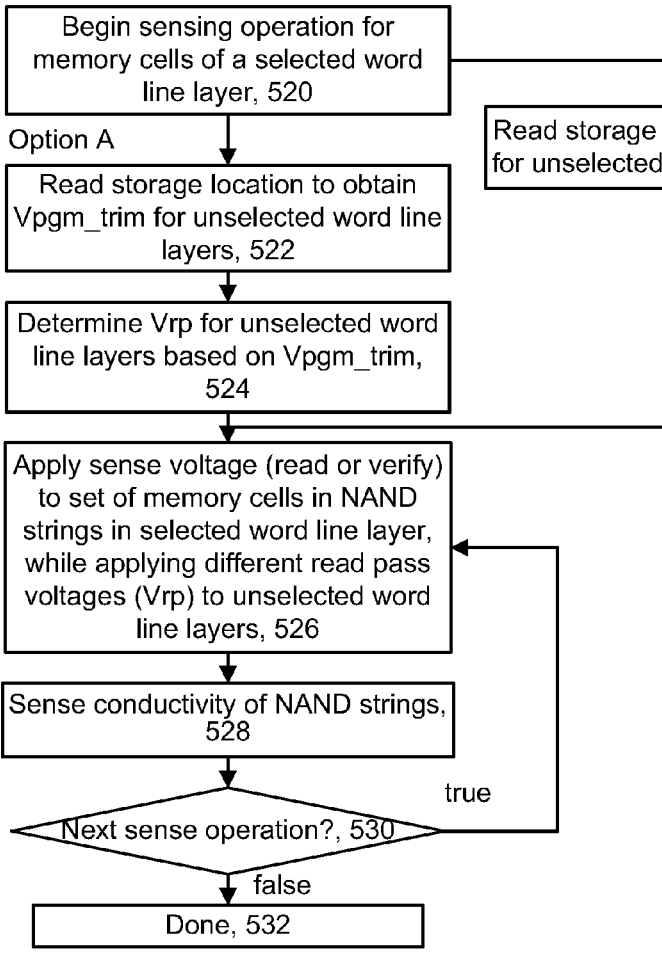

VREAD BIAS ALLOCATION ON WORD LINES FOR READ DISTURB REDUCTION IN 3D NON-VOLATILE MEMORY

BACKGROUND

The present technology relates to techniques for sensing memory cells in a 3D non-volatile memory device.

Recently, ultra high density storage devices have been proposed using a 3D stacked memory structure sometimes referred to as a Bit Cost Scalable (BiCS) architecture. For example, a 3D NAND stacked memory device can be formed from an array of alternating conductive and dielectric layers. A memory hole is drilled in the layers to define many memory layers simultaneously. A NAND string is then formed by filling the memory hole with appropriate materials. A straight NAND string extends in one memory hole, while a pipe- or U-shaped NAND string (P-BiCS) includes a pair of vertical columns of memory cells which extend in two memory holes and which are joined by a bottom back gate. Control gates of the memory cells are provided by the conductive layers. However, various challenges are presented in operating such memory devices.

BRIEF DESCRIPTION OF THE DRAWINGS

Like-numbered elements refer to common components in the different figures.

FIG. 2B1 depicts the block 200 FIG. 2A, showing example word line subsets WL23D-SB and WL23S-SB and example bit line subsets BL-SB0 and BL-SB1.

FIG. 2B2 depicts the block 200 FIG. 2A, showing example sets of NAND strings 210-215.

FIG. 2B3 depicts a cross-sectional width of a memory hole which flares out to a widest region near the top and is then tapered toward the bottom.

FIG. 2B4 depicts a variation in memory hole diameter in a stack of word line layers (WLLs), corresponding to FIG. 2B3.

FIG. 2B5 depicts the example NAND string NS0 of FIG. 2B2, where memory cells are arranged in groups having a similar memory hole diameter based on FIG. 2B3.

FIG. 2B6 depicts the example NAND strings NS0, NS0-1, NS0-2, . . . , NS0-14 of FIG. 2B2.

FIG. 3A depicts a close-up view of the region 236 of the column C0 of FIG. 2C, showing a drain-side select gate transistor SGD in the SG layer and a memory cell MC in word line layer WLL23.

FIG. 3B depicts a cross-sectional view of the column C0 of FIG. 3A.

FIG. 4A depicts a top view of a straight NAND string embodiment (block 480) of the block BLK0 of FIG. 1A, showing example SGD line subsets SGDL-SB0A and SGDL-SB1A and example bit line subsets.

FIG. 4B1 depicts the block BLK0 of FIG. 4A, showing an example WL line subset WL23-SB and example bit line subsets BL-SB0A and BL-SB1A.

FIG. 4B2 depicts the block BLK0 of FIG. 4A, showing example sets of NAND strings 216-219, 221 and 222.

FIG. 5A depicts a process for sensing memory cells of a selected WLL while applying a read pass voltage (Vrp) to memory cells of unselected WLLs as a function of a memory hole diameter.

FIG. 5B depicts an example of a process according to step 500 of FIG. 5A.

FIG. 5C depicts an example of a process according to step 502 of FIG. 5A.

DETAILED DESCRIPTION

Figure 1A:
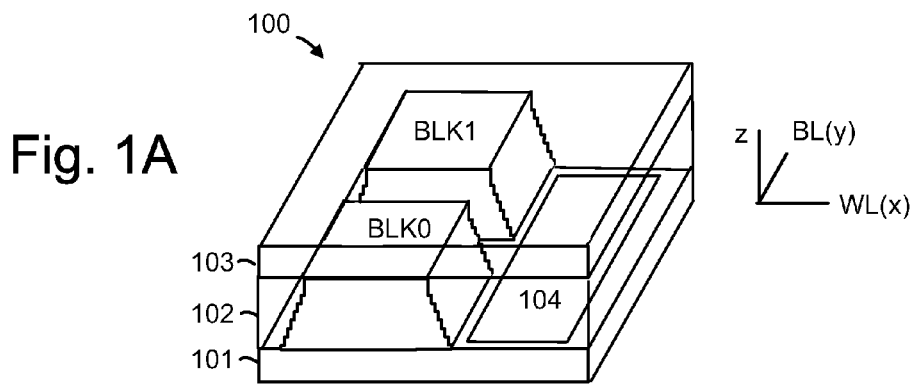
FIG. 1A is a perspective view of a 3D stacked non-volatile memory device.

Techniques are provided for sensing memory cells in a 3D stacked non-volatile memory device in a way which reduces read disturb, by using read pass voltages (Vrp) which are adjusted based on variations in a memory hole diameter.

In such a memory device, memory cells are formed along memory holes which extend through alternating conductive and dielectric layers in a stack. The memory cells are typically arranged in NAND strings. However, memory hole etching is challenging due to the very high aspect ratio. For example, a depth-to-diameter ratio of about 25-30 is common. The memory hole diameter (Dmh) can vary along the length of the hole. Typically, the diameter becomes progressively smaller from the top to the bottom of the memory hole, closer to the bottom of the stack. In some cases, a slight narrowing occurs at the top of the hole near the select gate so that the diameter becomes slight wider before becoming progressively smaller from the top to the bottom of the memory hole.

Due to the non-uniformity in the diameter of the memory hole, the programming and erase speed of the memory cells can vary based on their position along the memory hole. With a smaller diameter portion of a memory hole, the electric field across the tunnel oxide is stronger, so that the programming and erase speed is higher. Another result is that read disturb is more severe, reducing the reliability of the memory device. During a sensing operation (e.g., a read or verify operation), a moderately high read pass voltage is applied to unselected memory cells via unselected word line layers (WLLs) to provide the memory cells in a conductive state. Vrp has to be sufficiently higher than the upper tail of the threshold voltage (Vth) distribution of the highest data state to ensure that the unselected memory cells are provided in a conductive state. With the unselected memory cells in a non-conductive state, they do not interfere with the sensing of the selected memory cells.

However, the electric field created by Vrp acts as a weak programming voltage. The memory cells in the erased state are most affected by the electric field because they have the lowest Vth. As a result, the upper tail of the erased state Vth distribution of the unselected memory cells can increase and thereby decrease a read pass window. This problem becomes worse over time as more electrons are trapped in the charge trapping layer due to program-erase cycles.

Techniques provided herein address the above-mentioned issues. In one approach, during a sensing operation involving a selected WLL, Vrp is set higher for unselected WLLs which are adjacent to relatively wider portions of the memory holes. For conciseness, WLLs which are adjacent to relatively wider portions of the memory holes are referred to as large Dmh WLLs and their memory cells are referred to as large Dmh memory cells. Word line layers which are adjacent to relatively narrower portions of the memory holes are referred to as small Dmh WLLs and their memory cells are referred to as small Dmh memory cells.

This higher Vrp can result in additional read disturb for these WLLs. However, this additional read disturb is tolerable because the worst case read disturb is normally seen on the small Dmh WLLs. Moreover, Vrp is set lower on the small Dmh WLLs. This reduces read disturb for these WLLs. As a result, the amount of read disturb can be roughly equalized among the different WLLs. Further, by offsetting the decrease in Vrp on some WLLs with an increase on other WLLs, the current in the NAND strings during sensing can be maintained in an expected range so that sensing accuracy is not impaired. Sensing typically involves evaluating whether a selected memory cell is in a conductive or non-conductive state by determining whether the current in a NAND string is above or below, respectively, a reference current.

In another aspect, the programming speed of the different WLLs is determined as a proxy for the diameter of the portions of the memory holes adjacent to the different WLLs. The programming speed is greater when the memory hole diameter is smaller. In one approach, an initial programming voltage, or a trim value which is a function of an initial program voltage, is determined for different WLLs and stored in the memory device for later use during sensing. The trim value can be used to optimize programming on the WLLs, such as by ensuring that the different WLLs complete a programming pass after a roughly equal number of program loops. This results in a narrower Vth distribution.

Further, the trim value can be used to set a read pass voltage for unselected WLLs during a sensing operation. Since the trim value is already present for use in programming, it can be used for sensing with minimal additional cost. In another approach, Vrp is determined and stored in the memory device for use during sensing. To simplify the implementation, groups of WLLs which have a similar range of memory hole diameters can be assigned a same read pass voltage. A group can include adjacent and/or non-adjacent word lines.

Advantages of the above-mentioned techniques include reducing the worst case read disturb which occurs at narrower portions of the memory hole, at the bottom WLLs in a stack, without requiring modification of the reference current used during sensing.

The following discussion provides details of the construction of a memory device and of related programming and sensing techniques which address the above-mentioned issues.

FIG. 1A is a perspective view of a 3D stacked non-volatile memory device. The memory device 100 includes a substrate 101. On the substrate are example blocks BLK0 and BLK1 of memory cells and a peripheral area 104 with circuitry for use by the blocks. The substrate 101 can also carry circuitry under the blocks, along with one or more lower metal layers which are patterned in conductive paths to carry signals of the circuitry. The blocks are formed in an intermediate region 102 of the memory device. In an upper region 103 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While two blocks are depicted as an example, additional blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 1B:
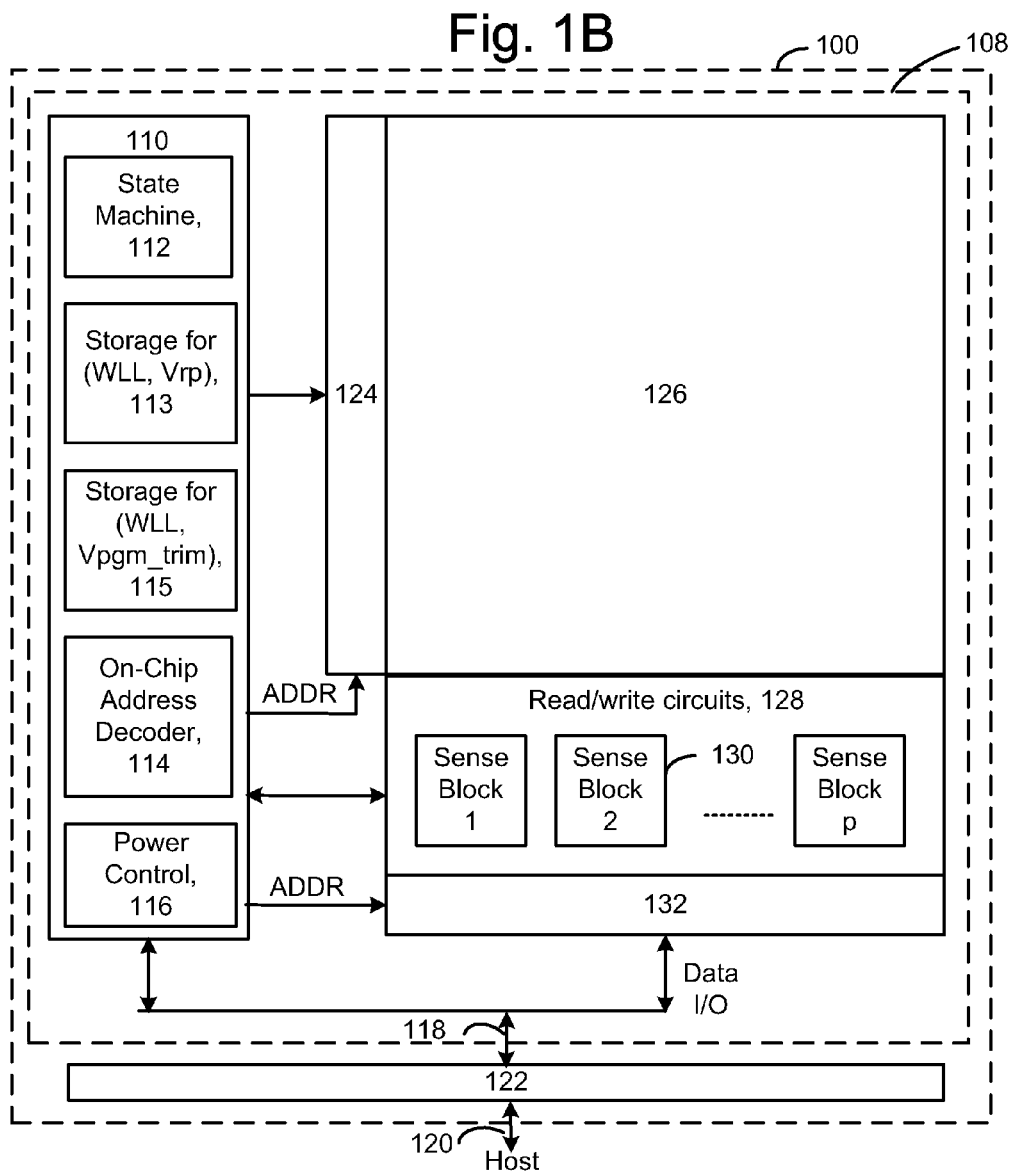
FIG. 1B is a functional block diagram of the 3D stacked non-volatile memory device 100 of FIG. 1A.

FIG. 1B is a functional block diagram of the 3D stacked non-volatile memory device 100 of FIG. 1A. The memory device 100 may include one or more memory die 108. The memory die 108 includes a 3D (three-dimensional) memory array 126 of memory cells, e.g., including the blocks BLK0 and BLK1, control circuitry 110, and read/write circuits 128. The memory array 126 is addressable by word lines via a row decoder 124 and by bit lines via a column decoder 132. The read/write circuits 128 include multiple sense blocks 130 (sensing circuitry) and allow a page of memory cells to be read or programmed in parallel. Typically a controller 122 is included in the same memory device 100 (e.g., a removable storage card) as the one or more memory die 108. Commands and data are transferred between the host and controller 122 via lines 120 and between the controller and the one or more memory die 108 via lines 118.

The control circuitry 110 cooperates with the read/write circuits 128 to perform memory operations on the memory array 126, and includes a state machine 112, an on-chip address decoder 114, and a power control module 116. The state machine 112 provides chip-level control of memory operations. The on-chip address decoder 114 provides an address interface between that used by the host or a memory controller to the hardware address used by the decoders 124 and 132. The power control module 116 controls the power and voltages supplied to the word lines and bit lines during memory operations. It can includes drivers for WLLs and WLL portions, drain- and source-side select gate drivers (referring, e.g., to drain- and source-sides or ends of a string of memory cells such as a NAND string, for instance) and source lines. The sense blocks 130 can include bit line drivers, in one approach.

A storage location 113 for (WLL, Vrp) entries may also be provided, where each entry identifies one or more WLLs and an associated read pass voltage (Vrp) to use during sensing. The storage location may be a table of entries, for instance. A storage location 115 for (WLL, Vpgm_trim) entries may also be provided, where each entry identifies one or more WLLs and an associated trim voltage to use during programming. For example, an initial program voltage may be set based on a sum of a fixed reference voltage and Vpgm_trim, as Vpgm_initial=Vpgm_ref+Vpgm_trim, as discussed, e.g., in connection with FIGS. 5B, 5D, 8, 11A and 11B. Vpgm_trim can be different for different WLLs due to a varying memory hole diameter so that Vpgm_initial can also be different for different WLLs. The storage locations may use ROM fuses or data registers, for example.

In some implementations, some of the components can be combined. In various designs, one or more of the components (alone or in combination), other than memory array 126, can be thought of as at least one control circuit. For example, a control circuit may include any one of, or a combination of, control circuitry 110, state machine 112, decoders 114/132, power control module 116, sense blocks 130, read/write circuits 128, and controller 122, and so forth.

In another approach, a non-volatile memory system uses dual row/column decoders and read/write circuits. Access to the memory array 126 by the various peripheral circuits is implemented in a symmetric fashion, on opposite sides of the array, so that the densities of access lines and circuitry on each side are reduced by half. Thus, the row decoder is split into two row decoders and the column decoder into two column decoders. Similarly, the read/write circuits are split into read/write circuits connecting to bit lines from the bottom and read/write circuits connecting to bit lines from the top of the memory array 126. In this way, the density of the read/write modules is reduced by one half.

Other types of non-volatile memory in addition to NAND flash memory can also be used.

Figure 2A:
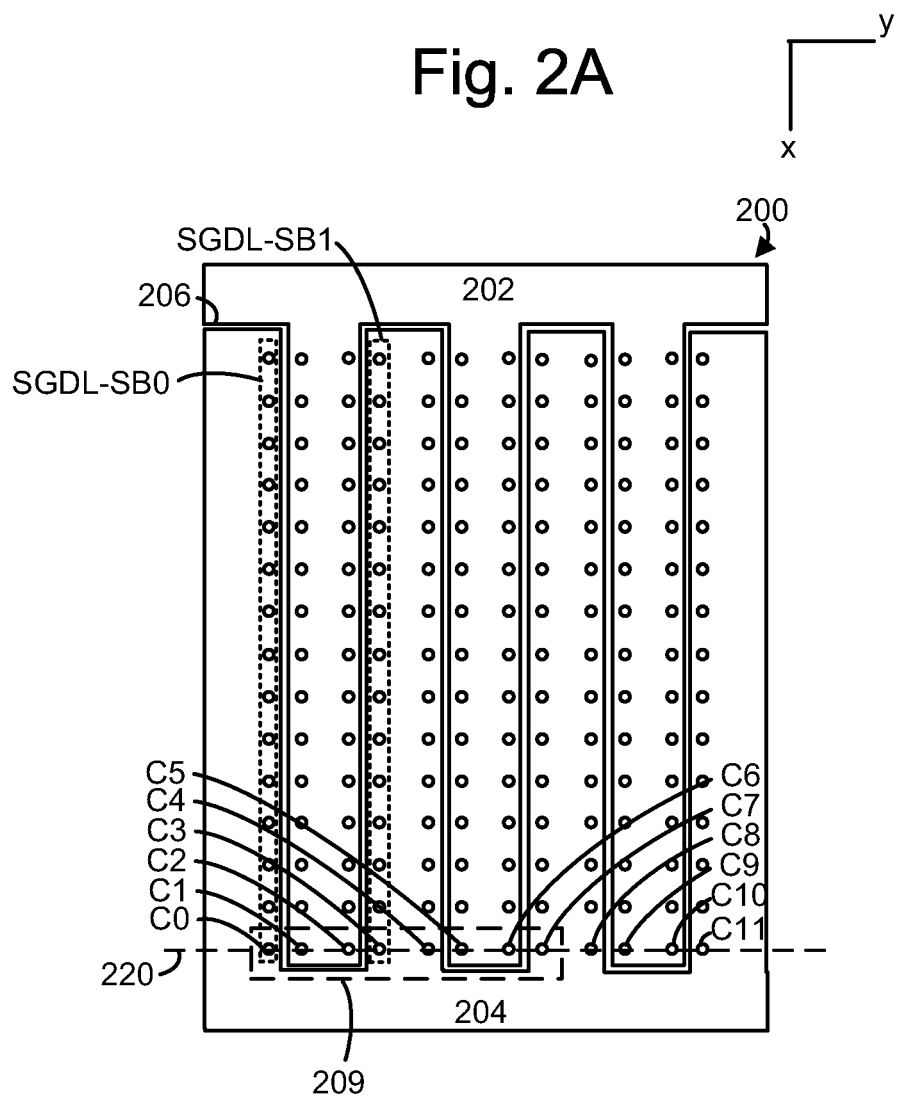
FIG. 2A depicts a top view of a U-shaped NAND embodiment of a block 200, showing example SGD line subsets SGDL-SB0 and SGDL-SB1, as an example implementation of BLK0 in FIG. 1A.
Figure 2C:
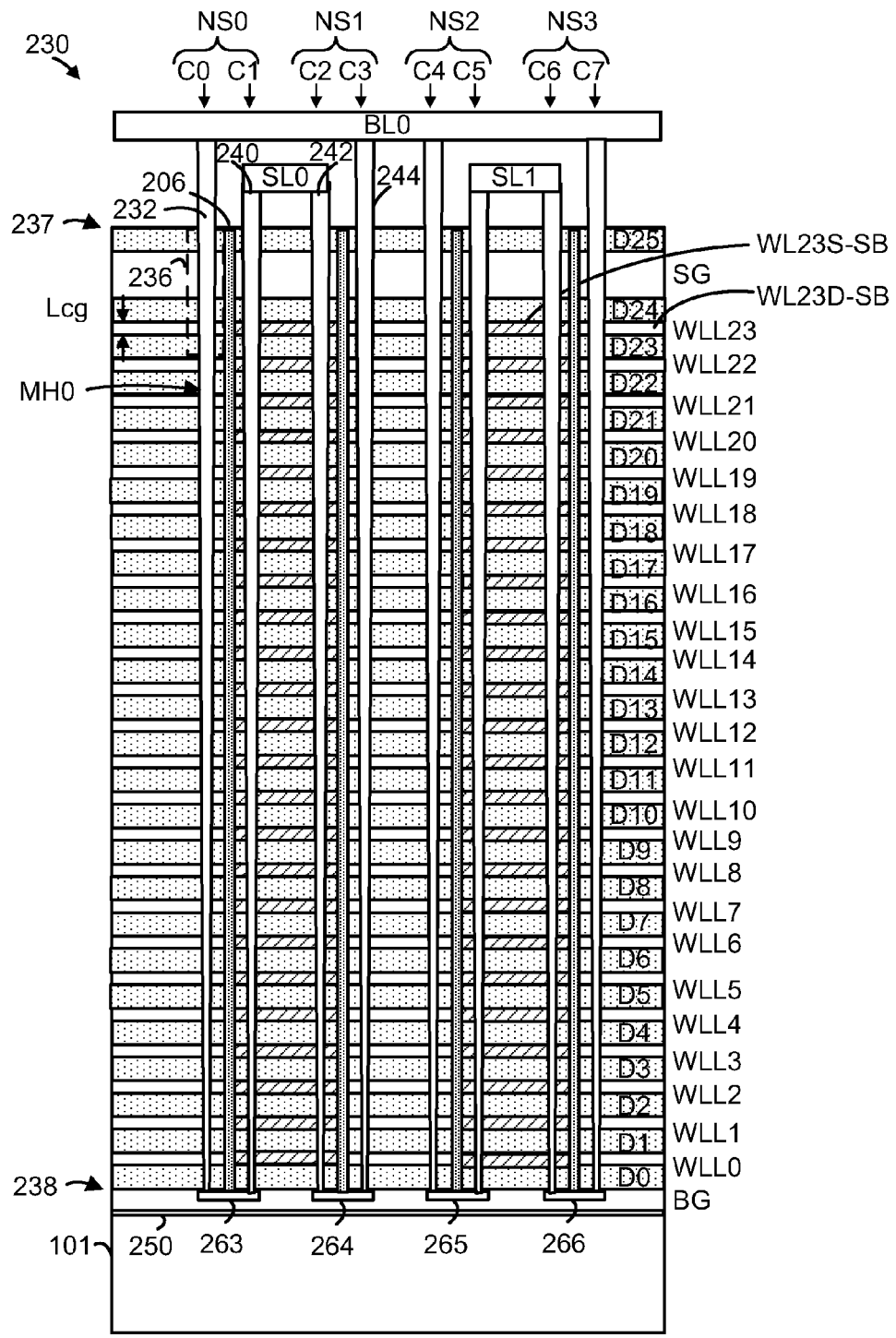
FIG. 2C depicts an embodiment of a stack 230 showing a cross-sectional view of the portion 209 of the block 200 of FIG. 2A, along line 220.

FIG. 2A depicts a top view of a U-shaped NAND embodiment of a block 200, showing example SGD line subsets SGDL-SB0 and SGDL-SB1, as an example implementation of BLK0 in FIG. 1A. The view is of a representative layer among the multiple WLLs in a stack. Referring also to FIG. 2C, the stack includes alternating dielectric and conductive layers. The dielectric layers include D0 to D25 and may be made of SiO2, for instance. The conductive layers include BG, which is a back gate layer, WLL0 to WLL23, which are WLLs, e.g., conductive paths to control gates of the memory cells at the layer, and SG, which is a select gate layer, e.g., a conductive path to control gates of select gate transistors of NAND strings. The word line layer (WLL) of FIG. 2A may represent any one of WLL0 to WLL23, for instance, in an example with twenty-four WLLs. The conductive layers may include doped polysilicon or metal silicide, for instance. An example voltage of 5-10 V may be applied to the back gate to maintain a conductive state which connects the drain- and source-side columns.

For each block, the WLL is divided into two WLL portions 202 and 204. Each block includes a slit pattern. A slit is a void which extends vertically in the stack, typically from an etch stop layer at the bottom to at least a top layer of the stack. The slit can be filled with insulation to insulate words line layer portions from one another. A slit 206 is a single continuous slit which extends in a zig-zag pattern in the block so that the block is divided into two portions, 202 and 204, which are insulated from one another. This approach can provide greater flexibility in controlling the memory cells since the WLL portions can be driven independently.

Each block includes rows of columnar, e.g., vertical, memory holes or pillars, represented by circles. Each row represents a vertical group of columns in the figure. The memory holes extend vertically in the stack and include memory cells such as in a vertical NAND string. Example columns of memory cells along a line 220 include C0 to C11. The figure represents a simplification, as many more rows of memory holes will typically be used, extending to the right and left in the figure. Also, the figures are not necessarily to scale. The columns of memory cells can be arranged in subsets such as sub-blocks.

Subsets of memory cells can be of different types, such as WL subsets, SGD line subsets and BL subsets.

A portion 209 of the block is depicted in further detail in connection with FIG. 2C.

FIG. 2B1 depicts the block 200 FIG. 2A, showing example word line subsets WL23D-SB and WL23S-SB and example bit line subsets BL-SB0 and BL-SB1. This example assumes that the WLL23 layer is depicted. WLL23S-SB is a WLL portion in communication with one (e.g., exactly one) memory cell in the source-side of each U-shaped NAND string, and WLL23D-SB is a WLL portion in communication with one (e.g., exactly one) memory cell in the drain-side of each U-shaped NAND string.

When U-shaped NAND strings are used, each SGD line subset can include two adjacent rows of columns of memory cells. In a subset, the adjacent rows are separated by the slit. The columns of memory cells on one side of the slit are drain-side columns (e.g., C0, C3, C4 and C7 in FIG. 2C) of NAND strings, and the columns of memory cells on the other side of the slit are source-side columns (e.g., C1, C2, C5 and C6 in FIG. 2C) of the NAND strings. Note that the pattern of two source-side columns between two drain-side columns repeats in the y-direction.

Word line drivers can independently provide signals such as voltage waveforms to the WLL portions 202 and 204.

The drawings are not to scale and do not show all memory columns. For example, a more realistic block might have 12 memory columns in the y direction as shown, but a very large number such as 32 k memory columns in the x direction, for a total of 384 k memory columns in a block. With U-shaped NAND strings, 192 k NAND strings are provided in this example. With straight NAND strings, 384 k NAND strings are provided in this example. Assuming there are twenty-four memory cells per column, there are 384 k×24=9,216 k memory cells in the set.

A set of NAND strings 210 of the block 200 is described further below in connection with FIG. 2B6. This represents a set of NAND strings which have SGD transistors controlled by a common SGD line. In one approach, this also represents a unit of memory cells which are programmed. Additional sets of NAND strings 211-215 are also depicted.

FIG. 2B2 depicts the block 200 FIG. 2A, showing example sets of NAND strings 210-215. The set of NAND strings 210 includes an example NAND string NS0, such as depicted in FIG. 2B5 and example memory cells MCD23-0, MCD23-1, MCD23-2, . . . , MCD23-14, as depicted in FIG. 2B6. In this notation, "MC" denotes a memory cell, "D" denotes a drain side of the NAND strings, and the number (0, 1, 2, . . . , 14) denotes a number of the NAND string based on its position in the stack. NAND strings NS1, NS2 and NS3 are also depicted (see, e.g., FIG. 2B).

FIG. 2B3 depicts a cross-sectional width of a memory hole which flares out to a widest region near the top and is then tapered toward the bottom. As mentioned at the outset, the memory hole diameter (Dmh) can vary along a length of a memory hole as represented by a central axis CA. The memory hole diameters can vary in different ways depending on the process used to create them. In this example, the memory hole flares out to a widest region near the top and is then tapered toward the bottom. An assumption is that the memory hole diameters vary in a similar way for a set of memory holes in a block so that the diameter is similar within a WLL, but different in different WLLs. The memory hole diameter is a function of the z coordinate (elevation or height) in the stack. In another possible configuration, the memory hole is uniformly tapered from top to bottom.

FIG. 2B4 depicts a variation in memory hole diameter (Dmh) in a stack of WLLs, corresponding to FIG. 2B3. Generally, Dmh varies in a stack of WLLs, in the vertical direction. The horizontal axis represents a distance in a stack ranging from a bottom word line to a top word line. As mentioned, the diameter tends to decrease toward the bottom of the stack. Dmh ranges from a minimum diameter, Dmh_min to a maximum diameter, Dmh_max. Dmh is expected to vary consistently among different memory holes in the memory device.

As explained further below in connection with FIGS. 3A and 3B, Dcore is a diameter of the core region of a memory hole and tends to vary with Dmh, and Wono+ch is the sum of the widths of an ONO region and a channel region. Wono+ch tends to be uniform in a memory hole since these materials are deposited on sidewalls of the memory holes aafter the memory holes are formed.

FIG. 2B5 depicts the example NAND string NS0 of FIG. 2B2, where memory cells are arranged in groups having a similar memory hole diameter based on FIG. 2B3. The example NAND string has a drain side 260 which extends between a bit line (BL) and a back gate (BG), and a source side 261 which extends between a source line (SL) and the BG. The drain side includes a SGD transistor and memory cells represented by control gates CGD0-CGD23. The source side includes a SGS transistor and memory cells represented by control gates CGS0-CGS23. Optionally, one or more dummy transistors on each side can be provided.

In this example, the memory cells are assigned to groups G0, G1, G2 (comprising subgroups G2a and G2b) and G3. Each group encompasses portions of the memory hole having a similar diameter. Moreover, groups G0, G1 and G3 include adjacent memory cells, while G2 includes non-adjacent memory cells (in subgroups G2a and G2b) and adjacent memory cells within each subgroup. In this case, programming and/or sensing operations can be customized for each group. The memory cells and WLLs within a group can be treated the same during programming and sensing since they will likely have similar characteristics, e.g., in terms of programming speed and susceptibility to read disturb. In one approach, a common Vpgm_trim can be used to program all WLLs within a group, and different groups of WLLs can have different values of Vpgm_trim. Similarly, a common Vrp can be used for all unselected WLLs within a group, and different groups of WLLs can have different values of Vrp.

Figure 10A:
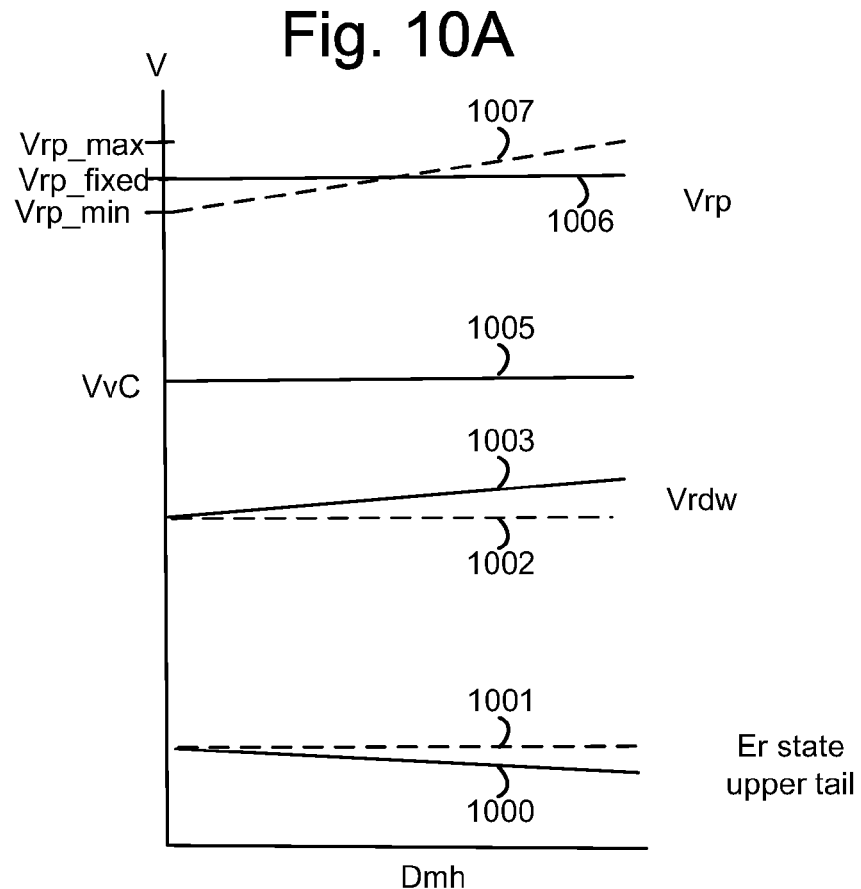
FIG. 10A is a graph depicting relationships between Vrp, Vrdw and the upper tail of the Erased state distribution.
Figure 10B:
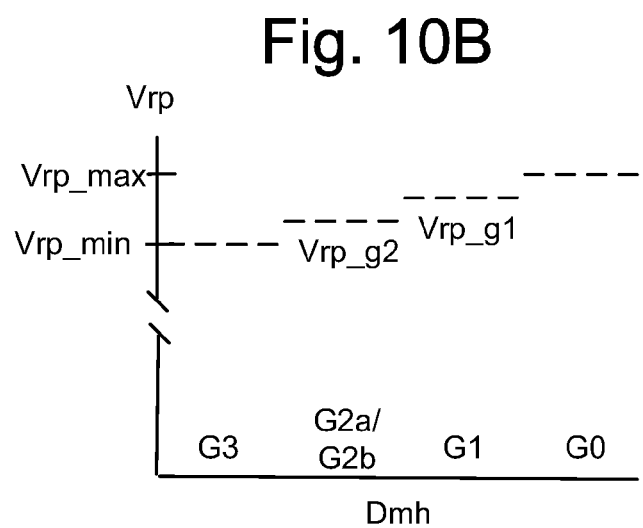
FIG. 10B depicts values of Vrp which can be set for different groups of unselected WLLs, according to FIG. 2B5.

See also FIG. 10B, which shows the use of a separate read pass voltage (Vrp) for each group during sensing operations. Each group includes memory cells on the drain and source sides of the NAND strings. In one approach, the groups have an equal number of memory cells. In another approach, the groups have an unequal number of memory cells. Two or more groups can be used. A group may encompass adjacent and/or non-adjacent memory cells within a set of NAND strings in a range of WLL portions.

For example, in the set of NAND strings 210, G0 includes the memory cells in WLL0-WLL6, G1 includes the memory cells in WLL7-WLL12, G2 includes the memory cells in WLL13-WLL18, WLL22 and WLDD23, and G3 includes the memory cells in WLL19-WLL21.

FIG. 2B6 depicts the example NAND strings NS0, NS0-1, NS0-2, . . . , NS0-14 of FIG. 2B2 of the set of NAND strings 210. A set of memory cells SetD-23 encompasses all of the memory cells on the drain sides of the set of NAND strings at WLL23, including MCD23-0, MCD23-1, MCD23-2, . . . , MCD23-14. These memory cells are adjacent to portions of respective memory holes MH0, MH0-1, MH0-2, . . . , MH0-14, which have a relatively wide diameter and can therefore by treated similarly in programming and sensing operations. Another example set of memory cells SetD-0 encompasses all of the memory cells on the drain sides of the NAND strings at WLL0, including MCD0-0, MCD0-1, MCD0-2, . . . , MCD0-14. These memory cells are adjacent to portions of respective memory holes which have a relatively narrow diameter and can therefore by treated similarly in programming and sensing operations. Additional sets of memory cells can be defined in a set of NAND string at each of the WLLs.

Portions of the memory holes are depicted as having varying diameters consistent with the groups of FIG. 2B5. For example, MH0 includes portions 286, 270, 274, 278 and 282, MH0-1 includes portions 287, 271, 275, 279 and 283, MH0-2 includes portions 288, 272, 276, 280 and 284, and MH0-14 includes portions 289, 273, 277, 281 and 285. G0 includes portions 282-285, G1 includes portions 278-281, G2 includes portions 274-277 and 286-289 and G3 includes portions 274-277. As a simplification, the memory hole diameters (Dmh) are shown as decreasing in uniform steps. In practice, the memory hole diameters tend to vary gradually as such as shown in FIG. 2B3.

FIG. 2C depicts an embodiment of a stack 230 showing a cross-sectional view of the portion 209 of the block 200 of FIG. 2A, along line 220. In one approach, the WLLs have a uniform thickness and the memory holes have another uniform thickness. Lcg represents a control gate length for the memory cells, which is the same as the thickness or height of each WLL. Columns of memory cells C0 to C7 are depicted in the multi-layer stack. The stack 230 includes the substrate 101, an insulating film 250 on the substrate, and a back gate layer BG, which is a conductive layer, on the insulating film. A trench is provided in portions of the back gate below pairs of columns of memory cells of a U-shaped NAND string. Layers of materials which are provided in the columns to form the memory cells are also provided in the trenches, and the remaining space in the trenches is filled with a semiconductor material to provide connecting portions 263 to 266 which connect the columns. The back gate thus connects the two columns of each U-shaped NAND string. For example, NS0 (NS=NAND string) includes columns C0 and C1 and connecting portion 263, and has a drain end 232 and a source end 240. NS1 includes columns C2 and C3 and connecting portion 264, and has a drain end 244 and a source end 242. NS2 includes columns C4 and C5 and connecting portion 265. NS3 includes columns C6 and C7 and connecting portion 266.

MH0 from FIG. 2B6, corresponding to C0, is depicted for reference. The memory hole is considered to be present in the final memory device even though the memory hole is filled in. As a simplification of the narrow-wide-narrow profile of FIG. 2B6, the memory hole is shown as becoming progressively and gradually narrower from the top 237 to the bottom 238 of the stack. The memory holes are columnar and extend at least from a top word line layer (WLL23) of the plurality of WLLs to a bottom word line layer (WLL0) of the plurality of WLLs.

The source line SL0 is connected to the source ends 240 and 242 of two adjacent memory strings NS0 and NS1. SL0 is also connected to other sets of memory strings which are behind NS0 and NS1 in the x direction. Recall that additional U-shaped NAND strings in the stack 230 (e.g., NS0-1, NS0-2, . . . , NS0-14 from FIG. 2B6) extend behind the U-shaped NAND strings depicted in the cross-section, e.g., along the x-axis, in a SGD line direction. The U-shaped NAND strings NS0 to NS3 are each in a different SGD line subset, but are in a common BL subset.

The slit 206 from FIG. 2A is also depicted as an example. In the cross-section, multiple slit portions are seen, where each slit portion is between the drain- and source-side columns of a U-shaped NAND string. A portion of the bit line BL0 is also depicted.

A region 236 of the stack is shown in greater detail in FIG. 3A.

Word line layers WLL0-WLL23 and dielectric layers D0-D24 extend alternatingly in the stack. The SG layer is between D24 and D2. Each WLL has a drain-side portion and a source-side portion. For example, WL23S-SB is a source-side sub-block of WLL23, and WL23D-SB is a drain-side sub-block of WLL23, consistent with FIG. 2B1. In each WLL, the diagonal line patterned region represents the source-side sub-block, and the unpatterned region represents the drain-side sub-block.

FIG. 3A depicts a close-up view of the region 236 of the column C0 of FIG. 2C, showing a drain-side select gate transistor SGD in the SG layer and a memory cell MC in word line layer WLL23. The region also shows portions of the dielectric layers D23 to D25. Each column includes a number of layers which are deposited along the sidewalls of the column. These layers can include oxide-nitride-oxide (O—N—O) and polysilicon layers which are deposited, e.g., using atomic layer deposition. For example, a block oxide (BOX) can be deposited as layer 296, a nitride such as SiN as a charge trapping layer (CTL) can be deposited as layer 297 and a tunnel oxide (TNL) can be deposited as layer 298, to provide the O—N—O layers. Further, a polysilicon body or channel (CH) can be deposited as layer 299, and a core filler dielectric can be deposited as region 300. Additional memory cells are similarly formed throughout the columns. Dmh represents the memory hole diameter, and Dcore represents the core diameter, which can both vary along the length or longitudinal axis of the memory hole, as discussed in connection with FIG. 2B4. Lcg3 represents the thickness of WLL23 and the control gate length for each memory cell in WLL23. Wono+ch, discussed previously, is also depicted.

When a memory cell is programmed, electrons are stored in a portion of the CTL which is associated with the memory cell. For example, electrons are represented by "−" symbols in the CTL 297 for the MC. These electrons are drawn into the CTL from the channel, and through the TNL. The Vth of a memory cell is increased in proportion to the amount of stored charge. As mentioned, electrons can become trapped in the CTL as additional program-erase cycles are experienced. This makes it easier for read disturb to occur.

Each of the memory holes is filled with a plurality of annular layers comprising a block oxide layer, a charge trapping layer, a tunneling layer and a channel layer. A core region of each of the memory holes is filled with a body material, and the plurality of annular layers are between the core region and the WLLs in each of the memory holes. Further, the diameter of the memory hole (Dmh) varies along a memory hole based on a variation in the diameter of the core region (Dcore) based on the assumption that Wono+ch is fixed, where Dcore+Wono+ch=Dmh.

FIG. 3B depicts a cross-sectional view of the column C0 of FIG. 3A. Each layer is ring-shaped in one possible approach, except the core filler, which is a tapered cylinder.

Figure 3C:
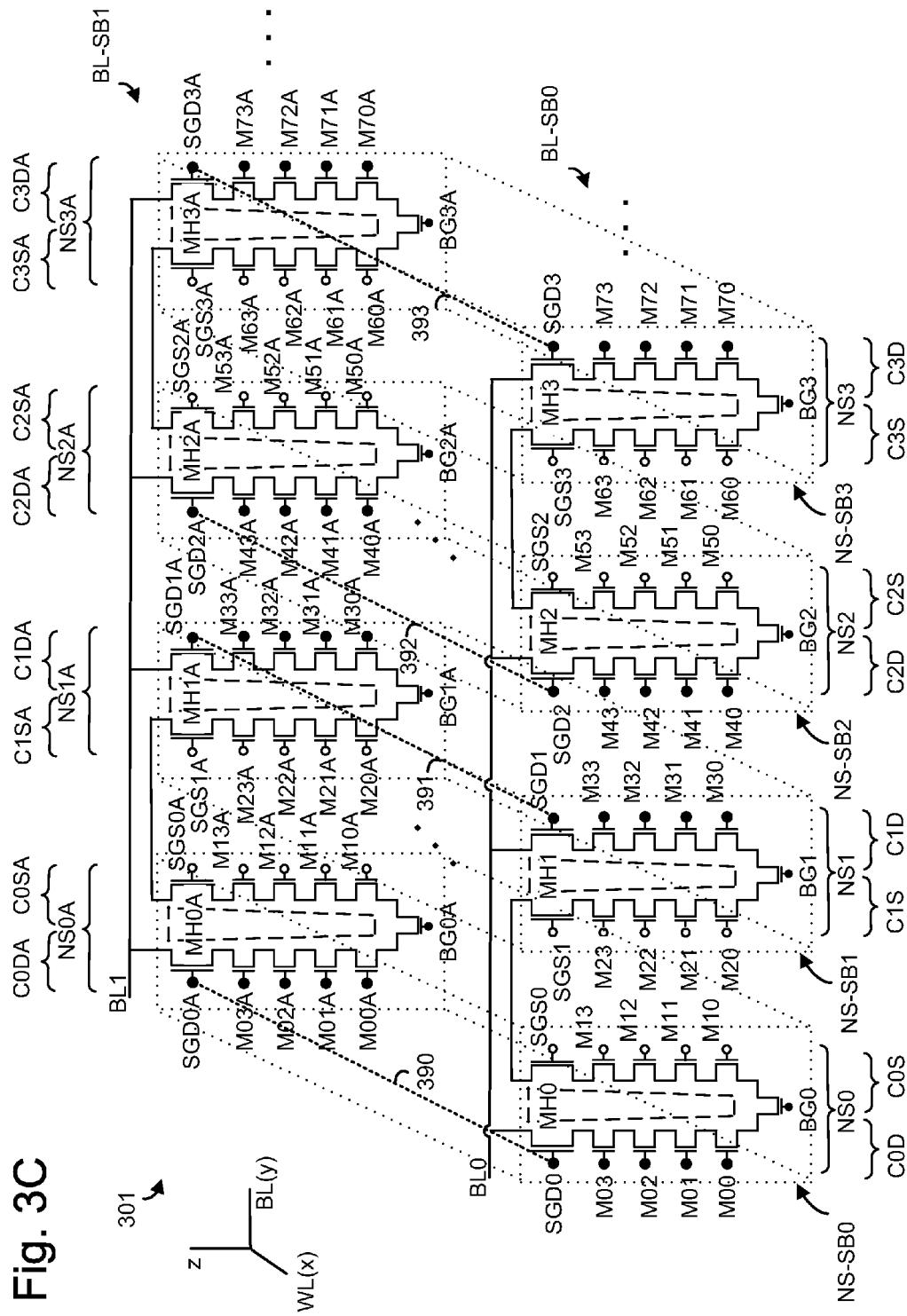
FIG. 3C depicts one embodiment of a circuit 301 for the NAND string sub-blocks NS-SB0 to NS-SB3 of FIG. 2A.

FIG. 3C depicts one embodiment of a circuit 301 for the showing example sets (or sub-blocks) of NAND strings 210-215 of FIG. 2A. As a simplification, four memory cells are provided per column. A set NS-SB0 includes NS0, . . . , NS0A, a set NS-SB1 includes NS1, . . . , NS1A, a set NS-SB2 includes NS2, . . . , NS2A and a set NS-SB3 includes NS3, . . . , NS3A. Each NAND string has memory cells along a respective memory hole. For example, NS-SB0 includes memory holes MH0, . . . , MH0A, NS-SB1 includes memory holes MH1, . . . , MH1A, NS-SB2 includes memory holes MH2, . . . , MH2A and NS-SB3 includes memory holes MH3, . . . , MH3A.

NAND strings NS0, NS1, NS2 and NS3 are in communication with a bit line BL0 (a first bit line) in BL-SB0 (a first bit line sub-block), and NAND strings NS0A, NS1A, NS2A and NS3A are in communication with a bit line BL1 (a second bit line) in BL-SB1 (a second bit line sub-block). In this example, each NAND string has a drain-side column with four memory cells and a SGD transistor, and a source-side column with four memory cells and a SGS transistor. The filled in circles indicate control gates of the select transistor and the memory cells on the drain side of a NAND string. The open circles indicate control gates of the select transistor and the memory cells on the source side of a NAND string.

For example, NS0 has a drain side column C0D comprising memory cells M00, M01, M02 and M03 and an SGD transistor SGD0, and a source side column C0S comprising memory cells M10, M11, M12 and M13 and an SGS transistor SGS0. NS1 has a drain side column CM comprising memory cells M30, M31, M32 and M33 and an SGD transistor SGD1, and a source side column C1S comprising memory cells M20, M21, M22 and M23 and an SGS transistor SGS1. NS2 has a drain side column C2D comprising memory cells M40, M41, M42 and M43 and an SGD transistor SGD2, and a source side column C2S comprising memory cells M50, M51, M52 and M53 and an SGS transistor SGS2. NS3 has a drain side column C3D comprising memory cells M70, M71, M72 and M73 and an SGD transistor SGD3, and a source side column C3S comprising memory cells M60, M61, M62 and M63 and an SGS transistor SGS3.

Similarly, NS0A has a drain side column C0DA comprising memory cells M00A, M01A, M02A and M03A and an SGD transistor SGD0A, and a source side column C0SA comprising memory cells M10A, M11A, M12A and M13A and an SGS transistor SGS0A. NS1A has a drain side column C1DA comprising memory cells M30A, M31A, M32A and M33A and an SGD transistor SGD1A, and a source side column C1SA comprising memory cells M20A, M21A, M22A and M23A and an SGS transistor SGS1A. NS2A has a drain side column C2DA comprising memory cells M40A, M41A, M42A and M43A and an SGD transistor SGD2A, and a source side column C2SA comprising memory cells M50A, M51A, M52A and M53A and an SGS transistor SGS2A. NS3A has a drain side column C3D comprising memory cells M70A, M71A, M72A and M73A and an SGD transistor SGD3A, and a source side column C3SA comprising memory cells M60A, M61A, M62A and M63A and an SGS transistor SGS3A.

Each NAND string has a back gate (BG0 for NS0, BG1 for NS1, BG2 for NS2, BG3 for NS3, BG0A for NS0A, BG1A for NS1A, BG2A for NS2A, BG3A for NS3A). The control gates of all of the back gates in the circuit may be connected to one another.

In one approach, the source side of each SGS transistor is connected to a common source line of the circuit.

At each level of the circuit, the control gates of the drain-side memory cells are connected to one another by a common WLL. For example, M03, M03A, M33, M33A, M43, M43A, M73 and M73A have control gates connected by a word line layer WL3D, consistent with FIG. 2B. M13, M13A, M23, M23A, M53, M53A, M63 and M63A have control gates connected by a word line layer WL3S, consistent with FIG. 2B.

M02, M02A, M32, M32A, M42, M42A, M72 and M72A have control gates connected by a word line layer WL2D. M12, M12A, M22, M22A, M52, M52A, M62 and M62A have control gates connected by a word line layer WL2S.

M01, M01A, M31, M31A, M41, M41A, M71 and M71A have control gates connected by a word line layer WL1D. M11, M11A, M21, M21A, M51, M51A, M61 and M61A have control gates connected by a word line layer WL1S.

M00, M00A, M30, M30A, M40, M40A, M70 and M70A have control gates connected by a word line layer WL0D. M10, M10A, M20, M20A, M50, M50A, M60 and M60A have control gates connected by a word line layer WL0S.

Additionally, control gates of the SGD transistors are connected to one another in respective NAND string sub-blocks. For example, in NS-SB0, control gates of SGD0, . . . , SGD0A are connected by path 390. In NS-SB1, control gates of SGD1, . . . , SGD1A are connected by path 391. In NS-SB3, control gates of SGD2, SGD2A are connected by path 392. In NS-SB3, control gates of SGD3, . . . , SGD3A are connected by path 393.

The control gates of the SGS transistors are connected to one another in the x-direction. For example, control gates of SGS0, . . . , SGS0A are connected, control gates of SGS1, . . . , SGS1A are connected, control gates of SGS2, . . . , SGS2A are connected, and control gates of SGS3, . . . , SGS3A are connected.

During a wafer die sort process described further below, at the top word line layer (WL3), in NS-SB0, an initial set of memory cells which is programmed can include memory cells M03, . . . , M03A and M13, . . . , M13A. This initial set of memory cells can be programmed to determine a value of Vpgm_trim or Vpgm_initial. In one approach, this Vpgm_trim or Vpgm_initial is also used for programming remaining sets of memory cells on WL3. This is reasonable since, as mentioned, memory cells on a common WLL having a similar memory hole diameter, or a group of WLLs having a similar memory hole diameter, are expected to have a similar programming speed. Subsequently, each lower WLL, or a representative WLL from each group, is programmed to determine an optimal Vpgm_trim or Vpgm_initial. An optimal Vrp can then be determined for each WLL or group of WLLs from Vpgm_trim or Vpgm_initial. FIG. 4A depicts a top view of a straight NAND string embodiment (block 480) of the block BLK0 of FIG. 1A, showing example SGD line subsets SGDL-SB0A and SGDL-SB1A.

In another approach, each memory cell at the top WLL is programmed to determine an optimal Vpgm_trim for the top WLL.

Figure 4C:
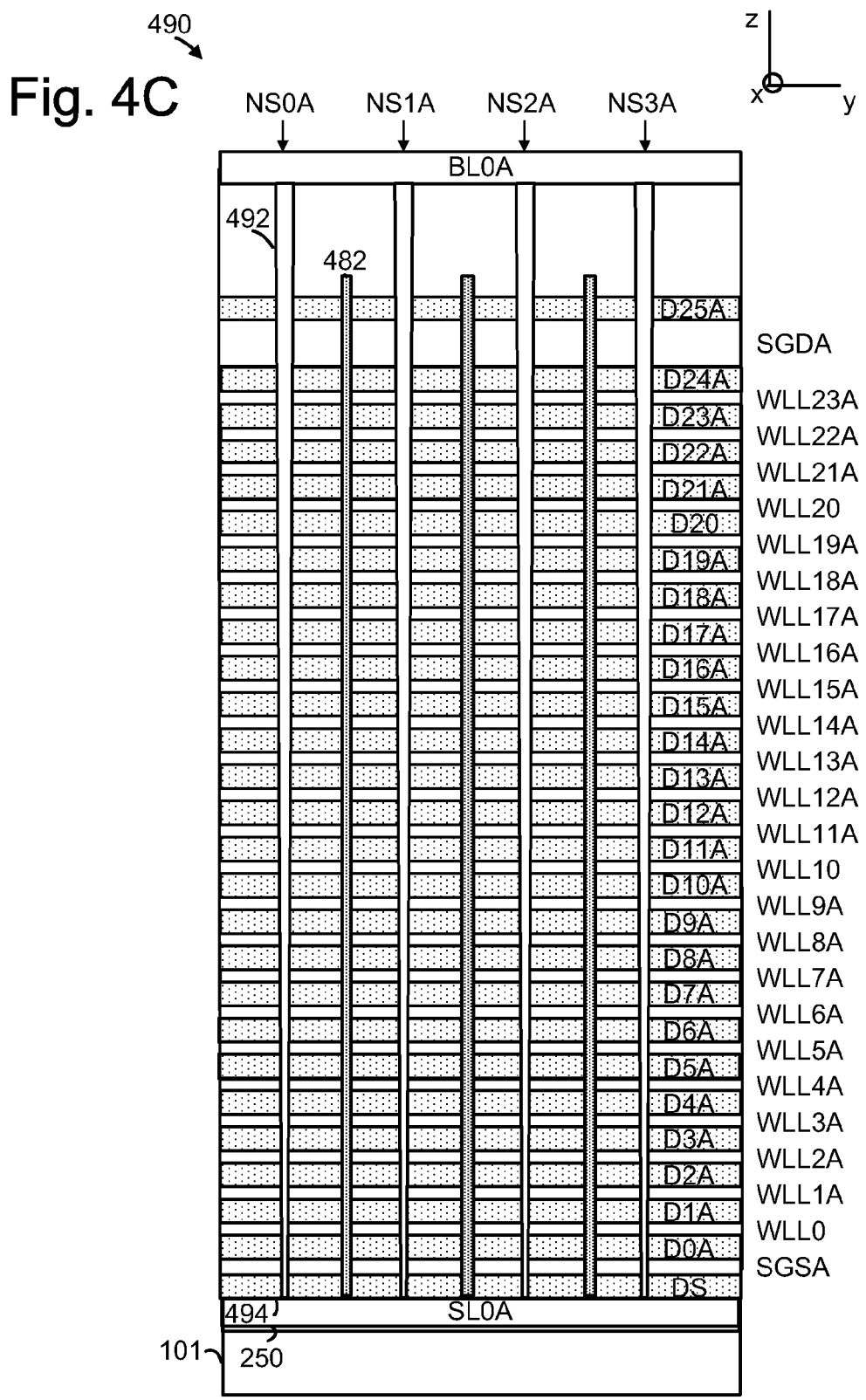
FIG. 4C depicts a cross-sectional view of the portion 488 of the block 480 of FIG. 4A along line 486.

In this configuration, a NAND string has only one column, and the source-side select gate is on the bottom of the column instead of on the top, as in a U-shaped NAND string. Moreover, a given level of a block has one WLL which is connected to each of the memory cells of the layer. For example, FIG. 4B1 depicts the block BLK0 of FIG. 4A, showing an example WL line subset WL23-SB and example bit line subsets BL-SB0A and BL-SB1A. A number of slits, such as example slit 482, can also be used. These insulation-filled slits are used in the fabrication process to provide structural support for the stack when undoped polysilicon layers are removed by a wet etch and a dielectric is deposited to form the alternating dielectric layers. A dashed line 486 extends through columns C12 to C17. A cross-sectional view along line 486 of portion 488 is shown in FIG. 4C.

FIG. 4B2 depicts the block BLK0 of FIG. 4A, showing example sets of NAND strings 216-219, 221 and 222. Example NAND strings NS0A-NS3A in the portion 488 are also depicted.

FIG. 4C depicts a cross-sectional view of the portion 488 of the block 480 of FIG. 4A along line 486. Columns of memory cells corresponding to NAND strings NS0A-NS3A in FIG. 4B2 are depicted in the multi-layer stack. The stack 490 includes a substrate 101, an insulating film 250 on the substrate, and a portion of a source line SL0A. Recall that the additional straight NAND strings in a SGD line subset extend in front of and in back of the NAND strings depicted in the cross-section, e.g., along the x-axis. NS0A has a source end 494 and a drain end 492. The slit 482 from FIG. 4A is also depicted with other slits. A portion of the bit line BL0A is also depicted. Dashed lines depict memory cells and select gate transistors. The techniques described herein can be used with a U-shaped or straight NAND. Word line layers WLL0-WLL23A are arranged alternatingly with dielectric layers D0A-D24A in the stack. An SGD layer, SGDA, an SGS layer, SGSA, and an additional dielectric layer DS are also depicted. SGDA is between D24A and D25A.

FIG. 5A depicts a process for sensing memory cells of a selected WLL while applying Vrp to memory cells of unselected WLLs as a function of a memory hole diameter (Dmh). A first step 500 involves determining programming speeds of memory cells of different WLLs. The programming speed is a function of Dmh, such that a higher programming speed is associated with a smaller Dmh. See FIG. 5B for further details.

A second step 502 involves performing a sensing operation for a set of memory cells of a selected WLL while applying Vrp on remaining, unselected WLLs which is a function of their programming speeds. See FIG. 5C for further details. The sensing operation can be performed multiple times after the programming speed is determined once.

FIG. 5B depicts an example of a process according to step 500 of FIG. 5A. Step 504 includes performing programming operations for memory cells of different WLLs (one WLL at a time), and determining respective programming speeds (e.g., in terms of a parameter called Vpgm_trim). Vpgm_trim can be determined separately for each WLL or for each group of WLLs. In one option (Option A), step 506 includes storing Vpgm_trim (and/or Vpgm_initial) indexed to WLL in a storage location (e.g., storage location 115 in FIG. 1B) of the memory device. In another option (Option B), step 508 includes determining Vrp based on Vpgm_trim for different WLLs. For example, the state machine can calculate Vrp using Vpgm_trim and the graph of FIG. 11B. Step 510 includes storing Vrp indexed to WLL in a storage location (e.g., storage location 113 in FIG. 1B) of the memory device.

FIG. 5C depicts an example of a process according to step 502 of FIG. 5A. Step 520 begins a sensing operation (e.g., a verify or read operation) for a selected WLL (a WLL in which memory cells are sensed). A WLL can be selected, e.g., by receiving a command which includes an address of the WLL, such as an address for writing or reading data which is received at the state machine via an external host device. A WLL could also be selected by the state machine without involvement of the external host.

For option A, step 522 involves reading the storage location 115 to obtain Vpgm_trim for unselected word line layers (WLLs in which memory cells are not sensed). Step 524 determines Vrp for the unselected WLLs based on Vpgm_trim using, e.g., the graph of FIG. 11B. For option B, step 534 reads the storage location 113 to obtain Vrp for the unselected WLLs. Steps 522 and 524 are examples of obtaining data which indicates respective programming speeds of memory cells of the unselected WLLs. In step 522, the data which indicates the respective programming speeds of memory cells of the unselected WLLs comprises data which indicates trim values of initial programming voltages for the unselected WLLs, and the trim values are relatively higher when the respective programming speeds are relatively lower.

Alternatively, step 522 obtains Vpgm_initial. In this case, the data which indicates the respective programming speeds of memory cells of the unselected WLLs comprises data which indicates initial programming voltages for the unselected WLLs, and the initial programming voltages are relatively higher when the respective programming speeds are relatively lower. Step 524 is an example of the read pass voltages being based on the data which indicates the respective programming speeds of memory cells of the unselected WLLs, and the read pass voltages being relatively lower when the respective programming speeds are relatively lower.

Figure 6A:
FIGS. 6A and 6B depict a one pass programming operation with four data states.

For either option, step 526 applies a sense voltage to a set of memory cells in the NAND strings in the selected WLL (e.g., one WLL), while applying different read pass voltages (Vrp) to the unselected WLLs. As mentioned, the Vrp values are optimized to minimize the worst case read disturb. For example, the sense voltage can be a read voltage such as VrA, VrB or VrC (FIG. 9A), or a verify voltage such as VvA, VvB or VvC (FIG. 9A) or VvAL, VvBL or VvCL (FIG. 6A).

Step 528 sense the conductivity of the NAND strings. With the sense voltage applied to the control gates of the selected memory cells, a NAND string should have a relatively high conductivity (current), e.g., above a reference current, when a selected memory cell of the NAND string is in a conductive state (e.g., when the control gate voltage exceeds the Vth of the memory cell). Conversely, a NAND string should have a relatively low conductivity (current) e.g., below the reference current, when a selected memory cell of the NAND string is in a non-conductive state (e.g., when the control gate voltage does not exceed the Vth of the memory cell). The unselected memory cells in a NAND string should be in a conductive state when Vrp is applied to their control gates.

As mentioned, the use of a higher Vrp for larger Dmh WLLs offsets the use of a lower Vrp for smaller Dmh WLLs, so that a reference current used by a sense amplifier can be the same regardless of the WLL of a selected memory cell which is being sensed. Specifically, each memory cell in a NAND string is associated with a portion of the NAND string channel. The resistance of each portion is inversely proportional to the value of Vrp of the associate memory cell, so that if Vrp is higher the resistance is lower, and if Vrp is lower the resistance is higher Further, the overall resistance of the NAND string is based on a sum of the resistances of each portion. In the techniques described herein, where Vrp is different for different memory cells in a NAND string, the channel portions with the higher resistance are offset by the channel portions with the lower resistance, so that the overall channel resistance can be the same, compared to a case where a fixed Vrp is used. With the voltage (V) applied by the sense amplifier and the overall NAND string channel resistance (R) being the same as the case where a fixed Vrp is used, the channel current (I) is also substantially the same (since I=V/R). As a result, Vrp can advantageously be adjusted to reduce the worst case read disturb without changing the reference current used for sensing.

At decision step 530, if there is a next sense operation, step 526 is repeated. If decision step 530 is false, the sensing process is done at step 532

Figure 5D:
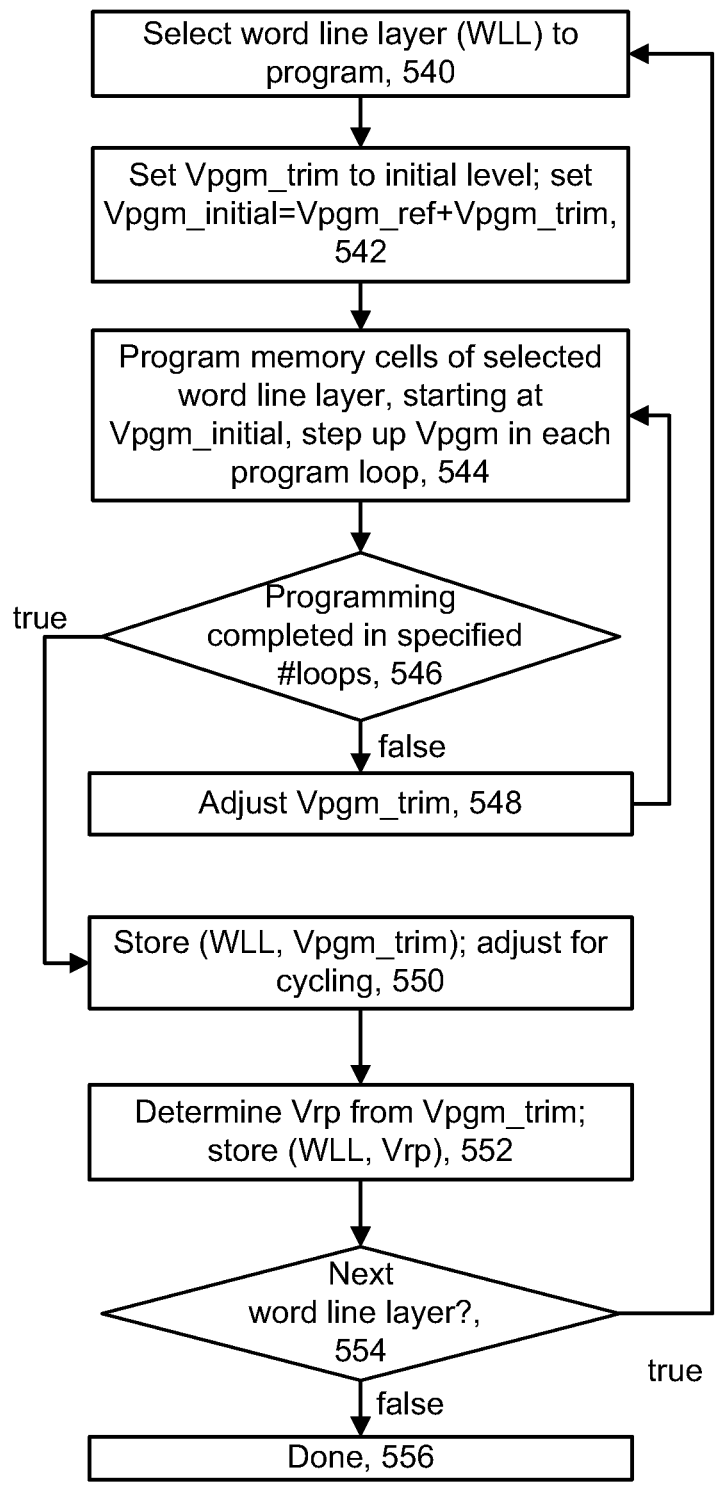
FIG. 5D depicts an example of a process for determining Vpgm_trim according to step 504 of FIG. 5B.

FIG. 5D depicts an example of a process for determining Vpgm_trim according to step 504 of FIG. 5B. As mentioned, Vpgm_trim can be optimized for each WLL or group of WLLs. In one approach, this optimization process is performed during a wafer die sort process at the manufacturing facility, before the memory device has been delivered to the end user, as described further, e.g., in connection with FIG. 12. Additional test equipment which is separate from the memory device can be used for this purpose. The Vpgm_trim values determined at this time can be intended for use throughout the lifetime of the memory device, in one approach. The Vpgm_trim values could also be determined by the memory device after it is delivered to the end user, without any separate test equipment.

Step 540 includes selecting a word line layer (WLL) to program. Step 542 sets Vpgm_trim to an initial level. Also, Vpgm_initial is set to Vpgm_ref+Vpgm_trim. Step 544 programs the memory cells of the selected WLL by applying a series of program pulses to the selected word line layer. Starting at Vpgm_initial, Vpgm is stepped up in each program loop. See also FIG. 8. Decision step 546 determines if programming is completed in a specified number of program loops (#loops). This condition can result in a narrower and more uniform Vth distribution among the different WLLs. If decision step 546 is true, the current value of Vpgm_trim is optimal and it is stored indexed to the WLL at step 550.

Optionally, groups of WLLs can be defined. In one approach, Vpgm_trim can be determined for each WLL. Word line layers having a common Vpgm_trim or range of Vpgm_trim can be grouped. For a group, one of the Vpgm_trim values can be selected as being representative of the group. For example, referring to FIG. 2B5, it may be determined that WLL0-WLL6 have Vpgm_trim values from 1-2 V. An average or median value such as 1.5 V may then be used as a Vpgm_trim value for the group. In another option, Vpgm_trim can be adjusted to account for future cycling effects in the memory device. For example, Vpgm_trim can be designed for a cycled memory device instead of a fresh memory device. One approach is to reduce Vpgm_trim further to offset an increase in programming speed with cycling (e.g., program-erase cycles). In another option, Vpgm_initial is determined from Vpgm_trim and stored for future use.

If decision step 546 is false, step 548 adjusts Vpgm_trim. Generally, if Vpgm_trim is too high, the programming will be completed in fewer than the specified number of loops. In this case, Vpgm_trim is decreased. If Vpgm_trim is too low, the programming will be completed in more than the specified number of loops, and Vpgm_trim is increased in step 548. After adjusting Vpgm_trim, step 544 is repeated.

This process is an example of determining a programming speed of memory cells of a selected WLL among a plurality of WLLs which are arranged alternatingly with dielectric layers in a stack, wherein the memory cells are arranged in respective memory holes which extend through the stack, and the respective memory holes have respective widths which vary along the memory holes; determining a read pass voltage for use in a sensing operation for the selected WLL based on the programming speed; and storing data in a storage location of the 3d non-volatile memory device identifying the read pass voltage.

Step 552 can be used as an alternative or addition to step 550. Step 552 determines Vrp from Vpgm_trim, such as by using the plot of FIG. 11B.

Decision step 554 determines if there is a next WLL to program. If decision step 554 is true, step 540 is repeated. If decision step 554 is false, the process is done at step 556.

During a program pulse, a bit line voltage (Vbl) is set to a level such as 0 V on selected NAND strings, or to an inhibit level such as 2-3 V on unselected NAND strings. Example programming techniques which can be used in step 544 follow. For one pass programming, the #loops in decision step 546 is for the one pass. For two or more pass programming, the #loops in decision step 546 can be for a selected pass.

Figure 6B:
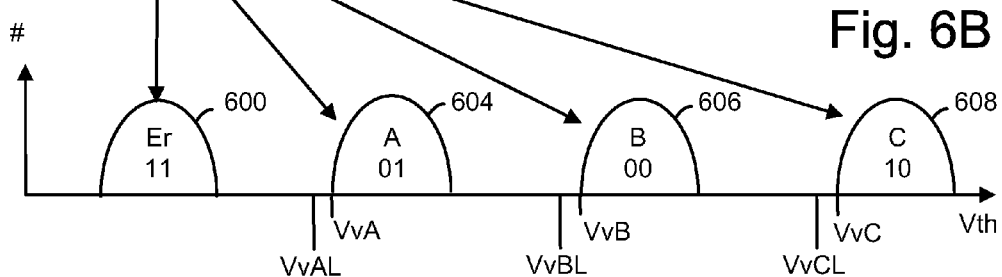

FIGS. 6A and 6B depict a one pass programming operation with four data states. One pass programming is also referred to as "one-pass write" programming which involves a sequence of multiple program-verify operations which are performed starting from an initial Vpgm level and proceeding to a final Vpgm level until the threshold voltages of a set of selected memory cells reach one or more respective verify levels of respective target data states. In one pass programming, all memory cells are initially in an erased state. Some of the memory cells are not programmed and remain in the erased state while others are programmed to higher target data states.

Example Vth distributions for the memory cell array are provided for a case where each memory cell stores two bits of data. Each graph depicts Vth on the horizontal axis and a number or population of memory cells in a Vth distribution on the vertical axis. One bit represents the LP data and the other bit represents the UP data. A bit combination can be denoted by the UP bit followed by the LP bit, e.g., 11 denotes UP=1 and LP=1, 01 denotes UP=0 and LP=1, 00 denotes UP=0 and LP=0 and 10 denotes UP=1 and LP=0. A first Vth distribution 600 is provided for erased (Er) state memory cells. Three Vth distributions 604, 606 and 608 represent target data states A, B and C, respectively, which are reached by memory cells when their Vth exceeds the nominal (higher) verify level VvA, VvB or VvC, respectively. In this case, each memory cell can store two bits of data in one of four possible Vth ranges, referred to as states Er (or E), A, B and C. A program option which uses a slow programming mode may be referred to as a "quick pass write" (QPW) technique. QPW can be used independently in one or more passes of a multiple pass programming technique. Although, generally, it is sufficient to use QPW in the final programming pass when accuracy is most important. QPW mode and slow programming mode are used interchangeably herein.

When QPW is used, lower verify levels (VvAL, VvBL or VvCL) are defined such that the memory cells enter a slow programming mode or zone (e.g., by raising the associated bit line voltages applied during program) when their Vth is between the lower verify level and the higher verify level of a respective target data state. The lower verify levels are offset below the respective higher verify levels, in one implementation. Specifically, when a verify test determines that the Vth of a memory cell exceeds the lower verify level associated with the target data state of the memory cell, a slow programming mode begins for the memory cell. Subsequently, when a verify test determines that the Vth of a memory cell exceeds the higher verify level associated with the target data state of the memory cell, the memory cell is inhibited from further programming. In some cases, QPW is used on fewer than all target data states.

The specific relationship between the data programmed into a memory cell and the Vth level of the memory cell depends upon the data encoding scheme adopted for the memory cells. In one embodiment, data values are assigned to the Vth ranges using a Gray code assignment so that if the Vth of a floating gate erroneously shifts to its neighboring physical state, only one bit will be affected. One example assigns "11," "01," "00" and "10" to the E, A, B- and C-states. Read reference voltages which are between the distributions are used for reading data from the memory cells. By testing whether the Vth of a given memory cell is above or below one or more of the read reference voltages, the system can determine the data state which is represented by a memory cell.

Figure 7A:
FIGS. 7A to 7C depict a two pass programming operation with four data states.
Figure 7B:
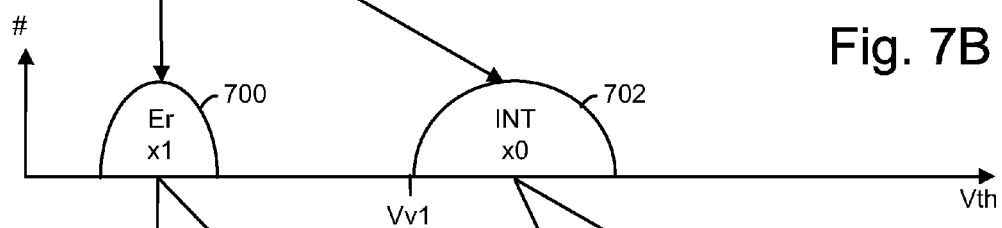
Figure 7C:
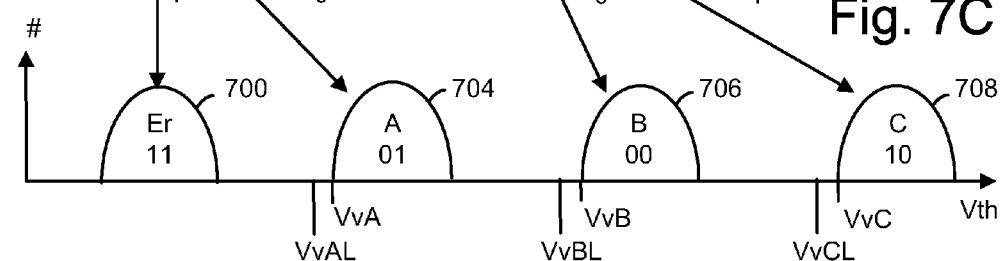

FIGS. 7A to 7C depict a two pass programming operation with four data states. Each pass can be used to program a page of data. For example, programming of lower and upper pages in two-bit, four-level memory cells is provided. Programming can be performed one logical page at a time, with the lower page followed by the upper page. Initially, all memory cells are in the Er state, represented by the distribution 700 in FIG. 7A.

FIG. 7B depicts programming of a lower page of data. If the lower page has a bit=1, the associated memory cell remains in the distribution 700 and the data is represented by x1, where x is an upper page bit that is not yet known. If the lower page has a bit=0, the memory cell is programmed to a higher Vth as represented by distribution 702, which is an interim distribution (INT), using a verify level Vv1. The data of these memory cells is represented by x0. Note that the interim distribution can be relatively wide since it is not a final distribution and does not represent a final data state.

FIG. 7C depicts programming of an upper page of data. If UP/LP=11, the associated memory cell in the distribution 700 remains in the distribution 700 and stores data bits 11. If UP/LP=01, the memory cells in the distribution 700 are programmed to the distribution 704 (state A) and a slow programming mode is used when the Vth is between VvAL and VvA. If UP/LP=10, the memory cells in the distribution 702 are programmed to the distribution 708 (state C) and a slow programming mode is used when the Vth is between VvCL and VvC. If UP/LP=00, the memory cells in the distribution 702 are programmed to the distribution 706 (state B) and a slow programming mode is used when the Vth is between VvBL and VvB.

Programming can be similarly extended to three or more bits per memory cell.

Figure 8:
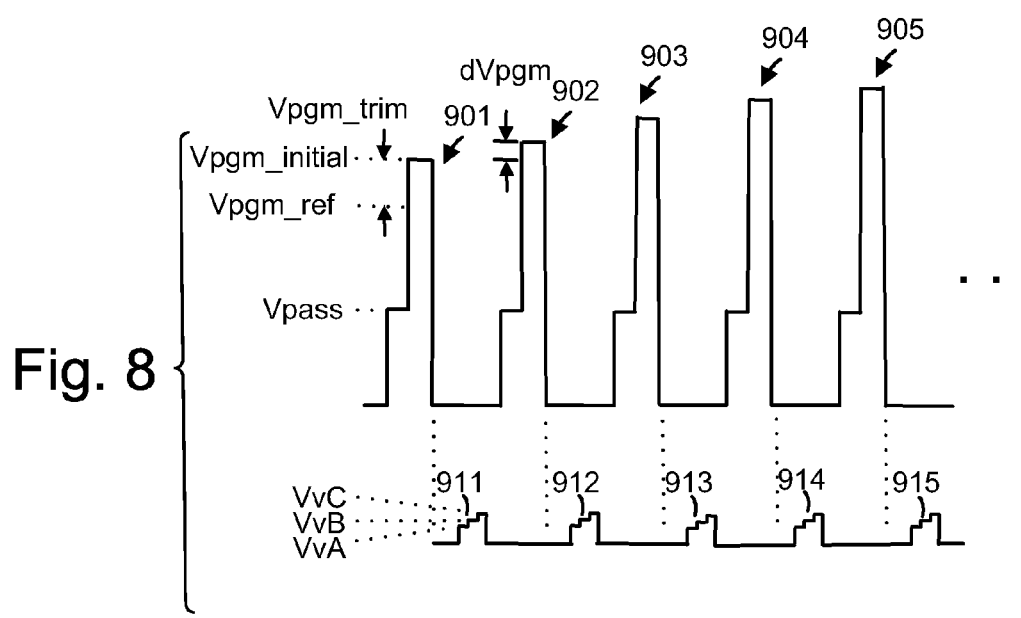
FIG. 8 depicts program and verify voltages for programming memory cells of a selected WLL to determine an optimal Vpgm_trim, in accordance with steps 542 and 544 of FIG. 5D.

FIG. 8 depicts program and verify voltages for programming memory cells of a selected WLL to determine an optimal Vpgm_trim, in accordance with steps 542 and 544 of FIG. 5D. A programming operation may include multiple program-verify iterations or loops, where each program-verify iteration includes a programming portion comprising a program pulse and a following verify operation comprising one or more verify voltages. The program pulse and verify voltages are applied to a selected WLL.

In one approach, the program pulses are stepped up in successive iterations by a step size, dVpgm. Moreover, each program pulse may include a first portion which has a pass voltage (Vpass) level, e.g., 6-8 V, followed by a second, peak amplitude portion at a program level, e.g., 12-25 V. For example, this programming pass includes program pulses 901-905 and associated sets of verify pulses 911-915, respectively. As discussed, the initial program pulse has a magnitude of Vpgm_initial=Vpgm_ref+Vpgm_trim. In this example, the verify pulses have a magnitude of VvA, VvB and VvC, corresponding to the programming process of FIGS. 6A and 6B.

Figure 9A:
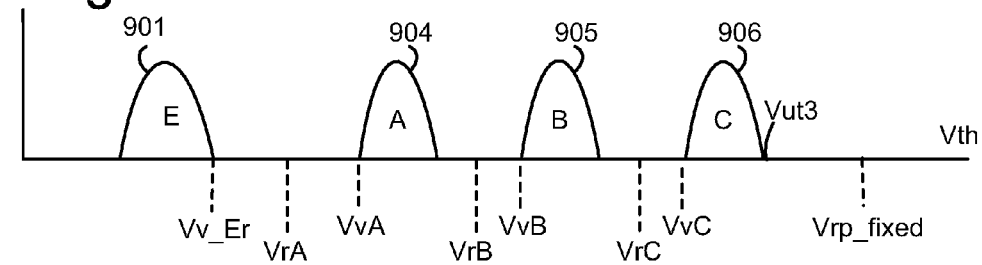
FIG. 9A depicts a threshold voltage (Vth) distribution with four data states, showing read voltages, verify voltages and a fixed read pass voltage (Vrp_fixed), where read disturb has not occurred.

FIG. 9A depicts a Vth distribution with four data states, showing read voltages, verify voltages and a fixed read pass voltage (Vrp_fixed), where read disturb has not occurred. The concepts shown through the example of four data states can be applied to memory devices using additional data states as well, e.g., eight or sixteen data states. The erased state, A state, B state and C state Vth distributions 901, 904, 905 and 906, respectively, are depicted. The distribution 901 is obtained after an erase operation, and the A state, B state and C state Vth distributions are obtained after programming. Vut3 represents a voltage of the upper tail of the C state distribution 906. Vrp_fixed is a fixed read pass voltage which is used on all WLLs, as a comparative example.

Before the memory cells have been read, there will be no read disturb, so that the erased state distribution 901 will remain below Vv_Er. Assume the distributions are for memory cells in one WLL. When memory cells in another WLL are sensed, Vrp_fixed is applied to the one WLL and the remaining WLLs. Vrp_fixed is sufficiently higher than Vut3 to cause all of the memory cells of the one word line layer to be in a conductive state. That is, Vrp_fixed meets a certain control gate over-drive requirement on all the unselected WLLs to guarantee that the memory cell current is above a certain level. This gate over-drive requirement, together with the highest state verify level, determines the minimum Vrp we can use without compromising the cell current.

The read levels are VrA, VrB and VrC. The verify voltages for the A, B and C states are VvA, VvB and VvC, respectively.

Figure 9B:
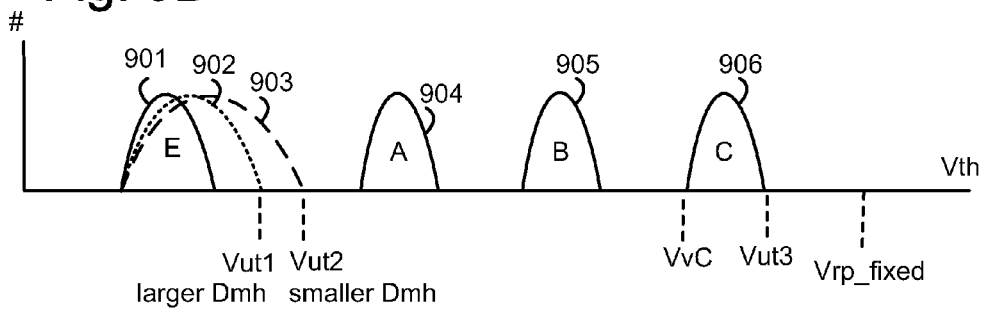
FIG. 9B depicts a Vth distribution corresponding to FIG. 9A, showing read disturb due to Vrp_fixed on an erased state distribution 902 for large Dmh memory cells, and on an erased state distribution 903 for small Dmh memory cells.

FIG. 9B depicts a Vth distribution corresponding to FIG. 9A, showing read disturb due to Vrp_fixed on an erased state distribution 902 for large Dmh memory cells, and on an erased state distribution 903 for small Dmh memory cells. The distributions 902 and 903, with upper tails of Vut1 and Vut2, respectively, represent read disturb which is caused in the memory cells of one WLL due to the use of Vrp_fixed on the one WLL during sensing operations of other WLLs. As mentioned, the electric field created by Vrp acts as a weak programming voltage. This electric field is stronger when Vrp is higher and for the narrower diameter portions of the memory holes, so that read disturb is worse. The upper tail is relatively higher for a set of small Dmh memory cells. Thus, the distributions 902 and 903 represent the cases where the one WLL is adjacent to larger or smaller diameter portions, respectively, of the memory holes.

Vut2 can be significantly higher than Vut1 (e.g., 1 V or more) due to variations between the narrowest and widest portions of the memory hole, so that the memory cells at the narrowest portions of the memory hole can represent a worst case read disturb. Thus, if the same Vrp is applied on all WLLs, the memory cells on the WLLs with the smallest memory hole diameter will be a bottleneck limiting the overall read disturb reliability.

A read window (Vrdw) can be defined as a difference between the upper tail of the erased state and the verify level of the highest state. For the distribution 902, the read window is VvC-Vut1. For the distribution 903, the read window is VvC-Vut2.

The increase in the upper tail (or the decrease in the read window) can lead to E to A-state read failures. For example, a portion of the Vth distribution 903 which exceeds VrA represents memory cells which will be read incorrectly as being in the A-state instead of the E-state. FIG. 10A also indicates how the read window decreases as Dmh decreases, when Vrp_fixed is used.

Figure 9C:
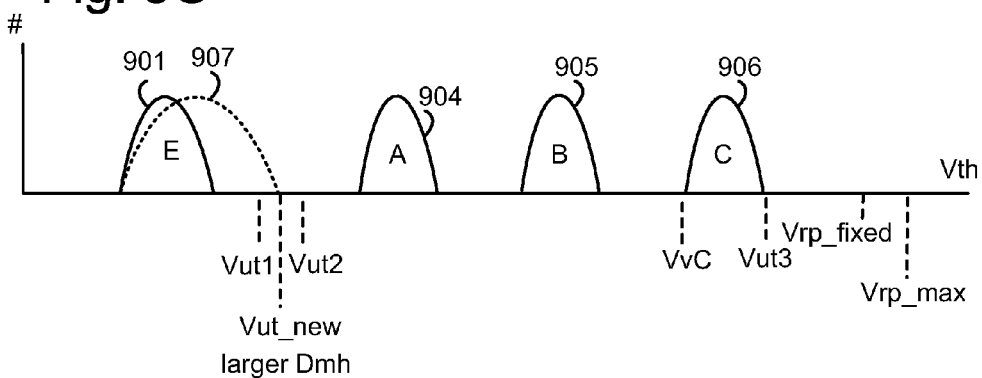
FIG. 9C depicts a Vth distribution corresponding to FIG. 9B, showing an increased read disturb due to Vrp_max>Vrp_fixed on the erased state distribution 907 for the large Dmh memory cells.

FIG. 9C depicts a Vth distribution corresponding to FIG. 9B, showing an increased read disturb due to Vrp_max>Vrp_fixed on the erased state distribution 907 for the large Dmh memory cells. By using Vrp_max>Vrp_fixed for the small Dmh WLLs, the distribution 907 is seen in place of the distribution 902. The upper tail increases from Vut1 to Vut_new due to increased read disturb. However, this allows a lower Vrp to be used for the small Dmh WLLs, so that the worst case read disturb is improved, as shown in FIG. 9D.

Figure 9D:
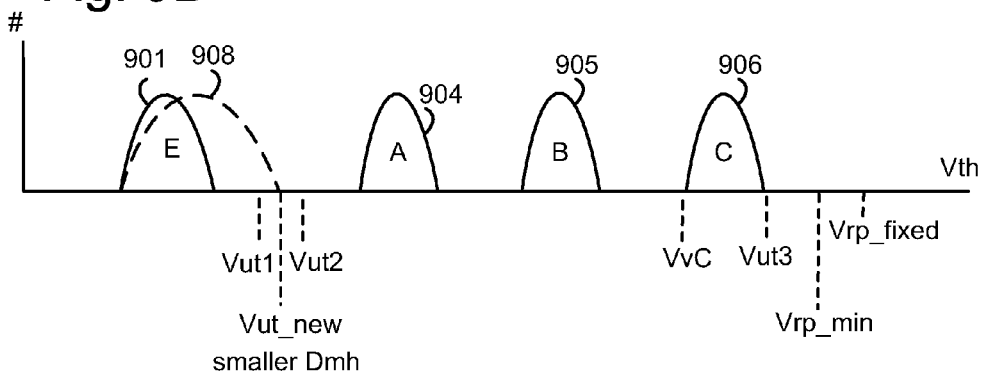
FIG. 9D depicts a Vth distribution corresponding to FIG. 9B, showing a decreased read disturb due to Vrp_min<Vrp_fixed on the erased state distribution 908 for the small Dmh memory cells.

FIG. 9D depicts a Vth distribution corresponding to FIG. 9B, showing a decreased read disturb due to Vrp_min<Vrp_fixed on the erased state distribution 908 for the small Dmh memory cells. By using Vrp_min<Vrp_fixed for the small Dmh WLLs, the distribution 908 is seen in place of the distribution 903. The upper tail decreases from Vut2 to Vut_new due to decreased read disturb. In this example, the same erased state upper tail is realized for the memory cells regardless of the adjacent memory hole diameter. In practice, the erased state upper tail can vary. One goal can be to avoid creating a new worse case program disturb by raising Vrp too high on the large Dmh memory cells.

In these examples, the unselected WLLs comprise memory cells which are programmed to a highest programmed data state (e.g., C state) of a plurality of data states (e.g., A, B and C states) using a common program-verify voltage (e.g., VvC). Further, a difference between the common program-verify voltage and the read pass voltages is relatively larger for the WLLs of the unselected large Dmh WLLs. For instance, the difference is Vrp_max−VvC for the unselected large Dmh WLLs, and Vrp_min−VvC for the unselected small Dmh WLLs, where (Vrp_max−VvC)>(Vrp_min−VvC).

A proposal is to use a Vrp which is lower than a nominal Vrp on small Dmh WLLs. To compensate for a reduction in cell current for these layers, a higher Vrp is applied on the large Dmh WLLs. With the lower Vrp on the small Dmh WLLs, the worst case read disturb can be improved. With a higher Vrp on the larger Dmh WLLs, the read disturb will become worse, but this is tolerable because it will be no worse than for the small Dmh WLLs, with the proper selection of Vrp.

FIG. 10A is a graph depicting relationships between Vrp, Vrdw and the upper tail of the Erased state distribution. The horizontal axis depicts the memory hole diameter, Dmh, and the vertical axis depicts voltage. Plot 1006 represents the case where Vrp_fixed is used on each unselected word line layer, regardless of Dmh. When Vrp_fixed is used, the erase state upper tail (plot 1000) decreases as Dmh increases. As a result, with Vvc fixed (plot 1005), the read window Vrdw (plot 1003) increases as Dmh increases.

In contrast, plot 1007 represents the case where Vrp increases as Dmh increases. Vrp varies between Vrp_min and Vrp_max. In this case, the erase state upper tail (plot 1001) is approximately constant as Dmh increases. As a result, with Vvc fixed (plot 1005), the read window Vrdw (plot 1002) is approximately constant as Dmh increases. Vrp can be varied based on control settings as mentioned. As an example, Vrp_fixed can be 7.5 V, Vr min can be 7 V and Vrp_max can be 8 V. VvC can be 5 V.

The techniques provided herein select Vrp to reduce the worst case read disturb, make read disturb approximately uniform for different WLLs, and provide an overall improvement in the read disturb characteristics of a memory device.

FIG. 10B depicts values of Vrp which can be set for different groups of unselected WLLs, according to FIG. 2B5.

Vrp can be set to Vrp_min for G3, to Vrp_g2 for G2 (comprising G2a and G2b), to Vrp_g1 for G1, and to Vrp_max for G0. As mentioned, the groups can include WLLs adjacent to portions of memory holes with a similar diameter. One way of identifying such WLLs is by a similar programming speed (e.g., a similar Vpgm_trim) as discussed in connection with FIG. 5D.

Figure 11A:
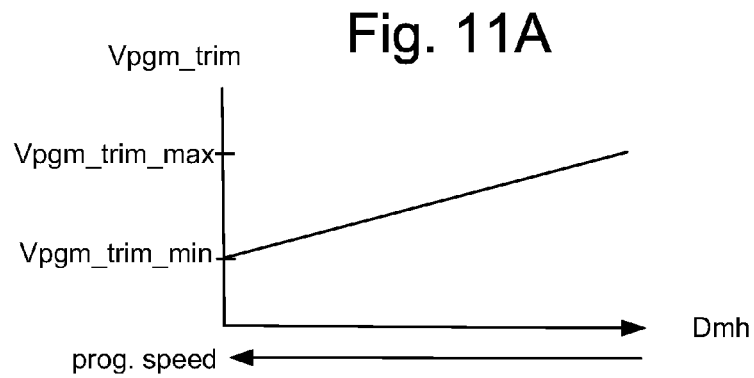
FIG. 11A depicts an increase in Vpgm_trim (vertical axis) with increasing memory hole diameter ($1^{st}$ horizontal axis) and decreasing programming speed ($2^{nd}$ horizontal axis).

FIG. 11A depicts an increase in Vpgm_trim (vertical axis) with increasing memory hole diameter ($1^{st}$ horizontal axis) and decreasing programming (prog.) speed ($2^{nd}$ horizontal axis). As mentioned, programming speed increases as Dmh decreases. Since Vpgm_trim decreases as programming speed increases, Vpgm_trim decreases as Dmh decreases. Vpgm_trim ranges from Vpgm_trim_min to Vpgm_trim_max. Example values are 1 V and 4 V, respectively.

Figure 11B:
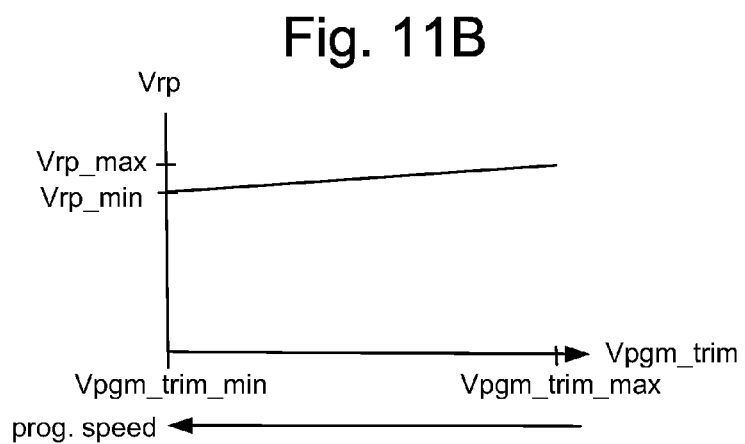
FIG. 11B depicts an increase in Vrp (vertical axis) with increasing Vpgm_trim ($1^{st}$ horizontal axis) and decreasing programming speed ($2^{nd}$ horizontal axis).

FIG. 11B depicts an increase in Vrp (vertical axis) with increasing Vpgm_trim ($1^{st}$ horizontal axis) and decreasing programming speed ($2^{nd}$ horizontal axis). Vpgm_trim increases as programming speed decreases. A slower programming speed is associated with a larger diameter portion of a memory hole, where a larger Vrp is used. Thus, Vrp increases, from Vrp_min to Vrp_max, as Vpgm_trim increases. The optimal relationship between Vrp and Vpgm_trim is based on the diameters of the memory holes. Also, the range of Vrp, from Vrp_min to Vrp_max, is based on the range of the diameters. When the range of the diameters is small, Vrp_max–Vrp_min is small. Further, the range of Vpgm_trim is correlated to the range of the diameters and to the range of Vrp.

This is an example of the read pass voltages being relatively lower when the respective programming speeds are relatively higher. Also, the trim values are relatively higher when the respective programming speeds are relatively lower.

Figure 11C:
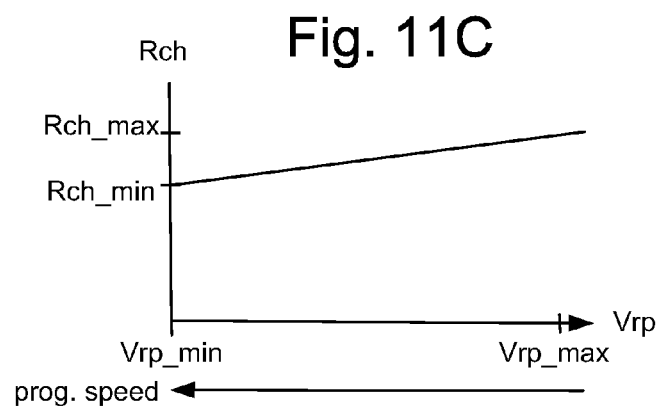
FIG. 11C depicts an increase in channel resistance (Rch) (vertical axis) in a NAND string with increasing Vrp ($1^{st}$ horizontal axis) and decreasing programming speed ($2^{nd}$ horizontal axis).

FIG. 11C depicts an increase in channel resistance (Rch) (vertical axis) in a NAND string with increasing Vrp ($1^{st}$ horizontal axis) and decreasing programming speed ($2^{nd}$ horizontal axis). Rch ranges from Rch_min to Rch_max. As mentioned, by using a higher Vrp on the large Dmh WLLs, portions of the NAND string channel associated with these WLLs will have a lower resistance (Rch). This offsets the higher resistance of portions of the NAND string channel associated with the small Dmh WLLs. As a result, the overall resistance of the NAND string channel may not be substantially changed due to the use of different read pass voltages, compared to the case of using a fixed Vrp.

Figure 12:
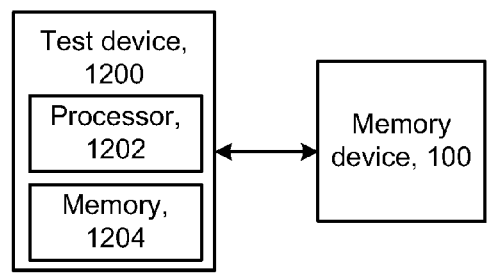
FIG. 12 depicts a test device connected to a memory device for determining Vpgm_trim.

FIG. 12 depicts a test device connected to a memory device for determining Vpgm_trim. The test device 1200 includes a processor 1202 and a memory 1204. The memory may include instructions which are executed by the processor to perform the process of FIG. 5D, for example. The test device may be used during a wafer die sort process at a manufacturing facility. The test device communicates with the memory device to determine optimum values of Vpgm_trim and/or Vrp for different WLLs of the memory device, and stores these optimum values in a storage location of the memory device. These values can subsequently be read and used to set Vrp during sensing operations. If Vrp is stored, it can be directly read and used during sensing. If Vpgm_trim is stored, it can be used to determine Vrp. Other approaches are possible as well.

Accordingly, it can be seen that, in one embodiment, a method for sensing in a 3d non-volatile memory device comprises: selecting a set of memory cells in a selected word line layer (e.g., one word line layer) of a plurality of word line layers to sense data, the plurality of word line layers are arranged alternatingly with dielectric layers in a stack, and memory cells in the set of memory cells in the selected word line layer are arranged in respective memory holes which extend through the stack, the respective memory holes having respective widths which vary along the memory holes; and in response to the selecting, sensing the set of memory cells in the selected word line layer, the sensing comprises applying a sense voltage to the selected word line layer while applying read pass voltages (Vrp) to unselected word line layers (e.g., remaining word line layers) of the plurality of word line layers, wherein the read pass voltages are relatively lower for word line layers of the unselected word line layers which are adjacent to relatively narrower portions of the memory holes.

In another embodiment, a 3d non-volatile memory device comprises: a plurality of word line layers arranged alternatingly with dielectric layers in a stack; a plurality of memory cells arranged in NAND strings and in communication with the plurality of word line layers, the NAND strings are arranged in respective memory holes which extend through the stack, the respective memory holes having respective widths which vary along the memory holes; and a control circuit. The control circuit, to sense data from a set of memory cells in selected word line layer of the plurality of word line layers: applies a sense voltage to the selected word line layer while applying read pass voltages (Vrp) to unselected word line layers of the plurality of word line layers, wherein the read pass voltages are relatively lower for word line layers of the unselected word line layers which are adjacent to relatively narrower portions of the memory holes.

In another embodiment, a method for configuring a 3d non-volatile memory device comprises: determining a programming speed of memory cells of a selected word line layer (e.g., one word line layer) among a plurality of word line layers which are arranged alternatingly with dielectric layers in a stack, wherein the memory cells are arranged in respective memory holes which extend through the stack, and the respective memory holes have respective widths which vary along the memory holes; determining a read pass voltage for use in a sensing operation for the selected word line layer based on the programming speed; and storing data in a storage location of the 3d non-volatile memory device identifying the read pass voltage.

The method further includes determining a programming speed of memory cells of another word line layer (e.g., any other word line layer) among the plurality of word line layers; determining a read pass voltage for use in a sensing operation for the another word line layer based on the programming speed of the memory cells of the another word line layer; and storing data in a storage location of the 3d non-volatile memory device identifying the read pass voltage for use in the sensing operation for the another word line layer.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for sensing in a 3d non-volatile memory device, comprising:

selecting a set of memory cells in a selected word line layer of a plurality of word line layers to sense data, the plurality of word line layers are arranged alternatingly with dielectric layers in a stack, and memory cells in the set of memory cells in the selected word line layer are arranged in respective memory holes which extend through the stack, the respective memory holes having respective widths which vary along the memory holes; and in response to the selecting, sensing the set of memory cells in the selected word line layer, the sensing comprises applying a sense voltage to the selected word line layer while applying read pass voltages to unselected word line layers of the plurality of word line layers, wherein the read pass voltages are relatively lower for word line layers of the unselected word line layers which are adjacent to relatively narrower portions of the memory holes.

2. The method of claim 1, further comprising:
obtaining data which indicates respective programming speeds of memory cells of the unselected word line layers, wherein the read pass voltages are based on the data which indicates the respective programming speeds of memory cells of the unselected word line layers, and the read pass voltages are relatively lower when the respective programming speeds are relatively higher.

3. The method of claim 2, wherein:
the data which indicates the respective programming speeds of memory cells of the unselected word line layers comprises data which indicates trim values of initial programming voltages for the unselected word line layers; and
the trim values are relatively higher when the respective programming speeds are relatively lower.

4. The method of claim 2, wherein:
the data which indicates the respective programming speeds of memory cells of the unselected word line layers comprises data which indicates initial programming voltages for the unselected word line layers; and
the initial programming voltages are relatively higher when the respective programming speeds are relatively lower.

5. The method of claim 2, wherein:
the data which indicates the respective programming speeds of memory cells of the unselected word line layers is read from a storage location in the 3d non-volatile memory device.

6. The method of claim 2, wherein:
the data which indicates the respective programming speeds of memory cells of the unselected word line layers is determined in a wafer die sort process involving the 3d non-volatile memory device.

7. The method of claim 1, wherein:
the unselected word line layers comprise memory cells which are programmed to a highest programmed data state of a plurality of data states using a common program-verify voltage; and
a difference between the common program-verify voltage and the read pass voltages is relatively larger for the word line layers of the unselected word line layers which are adjacent to relatively wider portions of the memory holes.

8. The method of claim 1, wherein:
the unselected word line layers of the plurality of word line layers comprise groups of adjacent word line layers; and
the read pass voltages are common within each group of word line layers.

9. The method of claim 1, wherein:
the sensing is performed in a read operation.

10. A 3d non-volatile memory device, comprising:
a plurality of word line layers arranged alternatingly with dielectric layers in a stack;
a plurality of memory cells arranged in NAND strings and in communication with the plurality of word line layers, the NAND strings are arranged in respective memory holes which extend through the stack, the respective memory holes having respective widths which vary along the memory holes; and
a control circuit, the control circuit, to sense data from a set of memory cells in selected word line layer of the plurality of word line layers, is configured to: apply a sense voltage to the selected word line layer while applying read pass voltages to unselected word line layers of the plurality of word line layers, wherein the read pass voltages are relatively lower for word line layers of the unselected word line layers which are adjacent to relatively narrower portions of the memory holes.

11. The 3d non-volatile memory device of claim 10, wherein:
the respective widths are progressively smaller closer to a bottom of the stack.

12. The 3d non-volatile memory device of claim 10, wherein:
the memory holes are columnar and extend at least from a top word line layer of the plurality of word line layers to a bottom word line layer of the plurality of word line layers.

13. The 3d non-volatile memory device of claim 10, wherein:
the control circuit is configured to obtain data which indicates respective programming speeds of memory cells of the unselected word line layers, wherein the read pass voltages are based on the data which indicates the respective programming speeds of memory cells of the unselected word line layers, and the read pass voltages are relatively lower when the respective programming speeds are relatively higher.

14. The 3d non-volatile memory device of claim 13, wherein:
the data which indicates the respective programming speeds of memory cells of the unselected word line layers comprises data which indicates trim values of initial programming voltages for the unselected word line layers; and
the trim values are relatively higher when the respective programming speeds are relatively lower.

15. The 3d non-volatile memory device of claim 10, wherein:
the unselected word line layers comprise memory cells which are programmed to a highest programmed data state of a plurality of data states using a common program-verify voltage; and
a difference between the common program-verify voltage and the read pass voltages is relatively larger for the word line layers of the unselected word line layers which are adjacent to relatively wider portions of the memory holes.

16. A method for configuring a 3d non-volatile memory device, comprising:
determining a programming speed of memory cells of a selected word line layer among a plurality of word line layers which are arranged alternatingly with dielectric layers in a stack, wherein the memory cells are arranged in respective memory holes which extend through the stack, and the respective memory holes have respective widths which vary along the memory holes;

determining a read pass voltage for use in a sensing operation for the selected word line layer based on the programming speed; and storing data in a storage location of the 3d non-volatile memory device identifying the read pass voltage, wherein the read pass voltages are relatively lower for word line layers of the plurality of word line layers which are adjacent to relatively narrower portions of the memory holes, and the read pass voltages are applied to unselected word line layers of the plurality of word line layers while sensing the memory cells of the selected word line layer.

17. The method of claim 16, wherein:
the determining the programming speed of the memory cells of the selected word line layer is performed in a wafer die sort process.

18. The method of claim 16, wherein:
the storage location comprise a ROM fuse.

19. The method of claim 16, further comprising:
determining a programming speed of memory cells of another word line layer among the plurality of word line layers;

determining a read pass voltage for use in a sensing operation for the another word line layer based on the programming speed of the memory cells of the another word line layer; and storing data in a storage location of the 3d non-volatile memory device identifying the read pass voltage for use in the sensing operation for the another word line layer.

20. The method of claim 16, wherein:
the data which indicates the programming speed of the memory cells of the selected word line layer comprises data which indicates a trim value of an initial programming voltage for the selected word line layer.

* * * * *